United States Patent
Murase et al.

(10) Patent No.: US 10,411,144 B2
(45) Date of Patent: Sep. 10, 2019

(54) SEMICONDUCTOR ELECTRODE, DEVICE COMPRISING THE SAME, AND A METHOD FOR FABRICATING THE SAME

(71) Applicant: Panasonic Intellectual Property Management Co., Ltd., Osaka (JP)

(72) Inventors: Hideaki Murase, Osaka (JP); Ryosuke Kikuchi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/979,931

(22) Filed: May 15, 2018

(65) Prior Publication Data

US 2018/0358482 A1    Dec. 13, 2018

(30) Foreign Application Priority Data

Jun. 7, 2017  (JP) .................................. 2017-112704

(51) Int. Cl.

| H01L 31/00 | (2006.01) |
|---|---|
| H01L 31/0224 | (2006.01) |
| C01B 3/02 | (2006.01) |
| H01L 31/18 | (2006.01) |
| H01L 31/0216 | (2014.01) |
| C01B 3/04 | (2006.01) |

(52) U.S. Cl.
CPC ............ *H01L 31/0224* (2013.01); *C01B 3/02* (2013.01); *C01B 3/042* (2013.01); *H01L 31/02167* (2013.01); *H01L 31/18* (2013.01)

(58) Field of Classification Search
CPC .............. H01L 31/18; H01L 31/0224; H01L 31/02245; H01L 31/022466; H01L 31/1013; H01L 31/02; H01L 31/1868; H01L 31/1884
USPC ........................................................ 257/448
See application file for complete search history.

(56) References Cited

U.S. PATENT DOCUMENTS

| 8,663,435 | B2 | 3/2014 | Suzuki et al. | |
|---|---|---|---|---|
| 2005/0196711 | A1* | 9/2005 | Shiroguchi | H01L 27/1292 |
| | | | | 430/330 |
| 2015/0111118 | A1* | 4/2015 | Nomura | C25B 1/003 |
| | | | | 429/422 |
| 2015/0322577 | A1* | 11/2015 | Kikuchi | C25B 11/04 |
| | | | | 205/638 |

FOREIGN PATENT DOCUMENTS

| JP | 2012-148250 | 8/2012 |
|---|---|---|
| WO | 2012/090390 | 7/2012 |

* cited by examiner

*Primary Examiner* — Theresa T Doan
(74) *Attorney, Agent, or Firm* — McDermott Will & Emery LLP

(57) ABSTRACT

A semiconductor electrode according to the present disclosure includes a conductive substrate; a semiconductor layer which is provided on the conductive substrate, and absorbs visible light; and a protection layer with which the semiconductor layer is coated, in which the protection layer is formed of an oxynitride, the visible light travels through the protection layer, and the protection layer has a thinner thickness than the semiconductor layer.

9 Claims, 7 Drawing Sheets

SEMICONDUCTOR ELECTRODE, DEVICE COMPRISING THE SAME, AND A METHOD FOR FABRICATING THE SAME

BACKGROUND

1. Technical Field

The present disclosures relates to a semiconductor electrode, device comprising the same, and a method for fabricating the same.

2. Description of the Related Art

When a semiconductor is irradiated with light, electron-hole pairs are generated in the semiconductor. Semiconductors can be applied to uses such as light emitting diodes (LEDs) and lasers which extract light generated in recombination of the electron-hole pairs; solar cells which spatially separate the pairs to extract photovoltaic power as electric energy; and photocatalysts which produce hydrogen directly from water and sunlight. Thus, semiconductors are promising. A group of semiconductors that absorb or release light in an ultraviolet-to-visible light range include oxides, oxynitrides and nitrides. Particularly, as semiconductors for use in photocatalysts, typically titanium oxide ($TiO_2$), zinc oxide (ZnO) and gallium nitride (GaN) have been used. A conventional semiconductor electrode including such a semiconductor has a problem of low hydrogen generation efficiency in water splitting reaction by irradiation of sunlight. This is because a semiconductor material such as $TiO_2$ can absorb only light having a short wavelength, generally a wavelength of not more than 400 nm, and in the case of $TiO_2$, a ratio of utilizable light to total sunlight is very low, i.e. about 4.7%. Further, considering a loss from a theoretical thermal loss, utilization efficiency of the sunlight is about 1.7% with respect to the absorbed light.

Thus, a semiconductor material capable of increasing a ratio of utilizable light to total sunlight, i.e. a semiconductor material capable of absorbing light in a visible light range, which has a longer wavelength, in order to improve hydrogen generation efficiency in water splitting reaction by irradiation of sunlight, is desired.

In response to this demand, a semiconductor material intended to improve utilization efficiency of sunlight by absorbing visible light having a longer wavelength has been suggested. For example, PTL 1 discloses a photocatalyst composed of a niobium oxynitride represented by compositional formula: NbON, as a semiconductor material capable of absorbing visible light. According to PTL 1, the niobium oxynitride is capable of absorbing light having a wavelength of not more than 560 nm. This indicates that the niobium oxynitride is a material in which the ratio of utilizable light to total sunlight is 28%, and that a sunlight energy conversion efficiency of up to 13% can be attained when a thermal loss is considered. PTL 2 discloses a photocatalyst device.

CITATION LIST

Patent Literatures

PTL 1: Japanese Patent No. 5165155
PTL 2: Japanese Patent laid-open Publication No. 2012-148250

SUMMARY

Some of materials proposed as semiconductors capable of absorbing visible light to spirit water suffer deterioration of water splitting performance with elapse of use time when used while being in contact with water.

One non-limiting and exemplary embodiment provides a semiconductor electrode which can be inhibited from suffering deterioration of performance with elapse of use time when used while being in contact with water.

In one general aspect, the techniques disclosed here feature a semiconductor electrode including:

a conductive substrate;
a semiconductor layer which is provided on the conductive substrate, and absorbs visible light; and
a protection layer with which the semiconductor layer is coated,
wherein
the protection layer is formed of an oxynitride,
the visible light travels through the protection layer, and
the protection layer has a thinner thickness than the semiconductor layer.

The semiconductor electrode of the present disclosure can be inhibited from suffering deterioration of performance with elapse of use time when used while being in contact with water.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

DETAILED DESCRIPTION OF THE EMBODIMENTS

Figure 1:
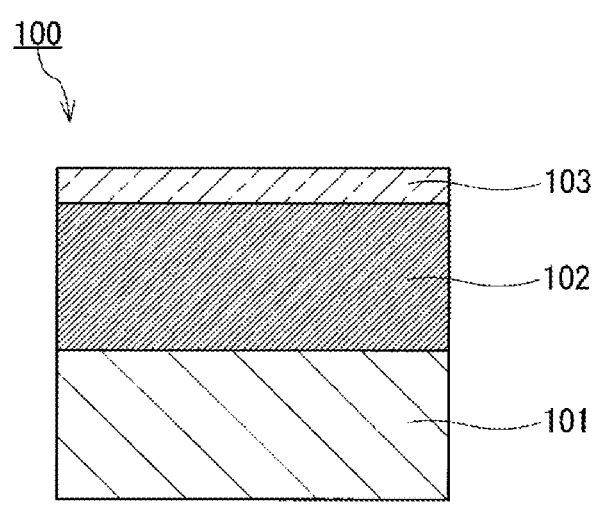
FIG. 1 is a sectional view of a semiconductor electrode according to one embodiment of the present disclosure.

<Underlying Knowledge Forming Basis of the Present Disclosure>

Hereinafter, circumstances leading to attainment of a semiconductor electrode according to the present disclosure will be described.

As described above, some of materials proposed as semiconductors capable of absorbing visible light to spirit water suffer deterioration of water splitting performance with elapse of use time when used while being in contact with water. Thus, when such a semiconductor is used while being in contact with water for splitting water, it is difficult to maintain a high photocurrent value over a long period of time. The photocurrent value gives an index for evaluation of hydrogen generation performance of a semiconductor in water splitting reaction. Thus, as one means for improving stability of a semiconductor in water splitting reaction, mention is made of a configuration in which a protection layer coating a semiconductor layer containing a semiconductor is provided.

As a material of the protection layer, a material stable to water should be selected. For example, an oxide stable to water, such as aluminum oxide, may be used as the material of the protection layer. However, use of an oxide such as aluminum oxide as the material of the protection layer for the semiconductor layer makes a potential barrier extremely high. Thus, holes charge-separated in the semiconductor contained in the semiconductor layer cannot tunnel through the protection layer, and are deactivated. As a result, water splitting reaction resulting from oxidation reaction is markedly reduced.

As a result of extensive studies with attention given to the above-mentioned problems arising when a protection layer is provided, the inventors of the present disclosure have devised a semiconductor electrode according to the present disclosure. Specifically, the inventors of the present disclosure have found that in a semiconductor electrode configured to include a semiconductor layer and a protection layer coating the semiconductor layer, when a potential barrier of the protection layer is made low, the protection layer is capable of protecting a surface of the semiconductor layer without impairing water splitting characteristics. The inventors of the present disclosure have also devised a fabrication method of such a semiconductor electrode, and a device including such a semiconductor electrode.

<Outline of One Aspect According to the Present Disclosure>

A semiconductor electrode according to a first aspect of the present disclosure includes:

a conductive substrate;

a semiconductor layer which is provided on the conductive substrate, and absorbs visible light; and a protection layer with which the semiconductor layer is coated, wherein the protection layer is formed of an oxynitride, the visible light travels through the protection layer, and the protection layer has a thinner thickness than the semiconductor layer.

The semiconductor electrode according to the first aspect of the present disclosure includes the protection layer coating the semiconductor layer. Thus, in the semiconductor electrode according to the first aspect, the semiconductor layer can be prevented from coming into direct contact with water in a water splitting process by sunlight. As a result, degradation of a semiconductor by chemical oxidation can be prevented. In addition, the protection layer contains an oxynitride. The protection layer containing an oxynitride is stable to water, and a potential barrier of the protection layer can be made lower than that of a protection layer including only an oxide. Thus, the protection layer can protect a surface of the semiconductor layer without impairing water splitting characteristics of the semiconductor.

The potential barrier will now be described in detail. Theoretical formulae of a stepping potential barrier are expressed as follows.

[Mathematical Formula 1]

$$T = \frac{1}{1 + \frac{1}{4}\left(\frac{k_2}{k_1} + \frac{k_1}{k_2}\right)^2 \sinh^2 k_2 d} \quad (1)$$

[Mathematical Formula 2]

$$k_1^2 = \frac{8\pi^2 mE}{h^2} \quad (2)$$

[Mathematical Formula 3]

$$k_2^2 = \frac{8\pi^2 m(V - E)}{h^2} \quad (3)$$

In the theoretical formulae (1) to (3), $k_1$, $k_2$, V, E, h, m, T and d are as follows.

k1: wavenumber k2: wavenumber

V: potential barrier (J)

E: kinetic energy (J)

h: Planck's constant (Js)

m: mass (kg)

T: transmission probability d: barrier thickness (m)

As expressed in the theoretical formulae (1) to (3), a transmission (i.e. tunneling) probability of minor carriers decreases depending on a size of the potential barrier. Thus, it is preferred that the potential barrier is low.

Visible light travels through the protection layer of the semiconductor electrode according to the first aspect. Thus, visible light applied to the semiconductor electrode can be preferentially absorbed in the semiconductor layer. Accordingly, in the semiconductor electrode according to the first aspect, deterioration of charge separation efficiency by absorption of light in the protection layer does not occur, and reduction of photovoltaic power due to absorption of light by the protection layer can be suppressed.

For this reason, the semiconductor electrode according to the first aspect can be inhibited from suffering deterioration of performance with elapse of use time when used while being in contact with water.

The conductive substrate included in the semiconductor electrode according to the first aspect is not required to be electrically conductive in its entirety. Specifically, in the first aspect, the conductive substrate includes both of a substrate that is electrically conductive in its entirety, and a substrate having a configuration in which a substrate that is not electrically conductive, such as a sapphire substrate, is provided with an electrically conductive film.

A second aspect may be, for example, the semiconductor electrode according to the first aspect in which the oxynitride that forms the protection layer is an oxynitride of at least one element selected from the group consisting of aluminum, silicon and zirconium.

In a semiconductor electrode according to the second aspect, the protection layer formed of the oxynitride is excellent in function of protecting a surface of a semiconductor layer without impairing water splitting characteristics of a semiconductor. Thus, with the semiconductor electrode according to the second aspect, a photocurrent value in water splitting reaction can be improved.

A third aspect may be, for example, the semiconductor electrode according to the second aspect in which the oxynitride that forms the protection layer is an aluminum oxynitride.

In a semiconductor electrode according to the third aspect, the protection layer formed of the oxynitride is excellent in function of protecting a surface of a semiconductor layer without impairing water splitting characteristics of a semiconductor. Thus, with the semiconductor electrode according to the third aspect, the photocurrent value in water splitting reaction can be improved.

A fourth aspect may be, for example, the semiconductor electrode according to any one of the first to third aspects in which the semiconductor layer is formed of one selected from the group consisting of a nitride semiconductor and an oxynitride semiconductor.

In a semiconductor electrode according to the fourth aspect, the semiconductor layer is formed of a nitride semiconductor or an oxynitride semiconductor. A valence band in a nitride semiconductor or oxynitride semiconductor is constituted by an N2p orbit level. The N2p orbit level is closer to an oxidized level of water than an O2p orbit. In other words, an energy level of the valence band in the nitride semiconductor or oxynitride semiconductor is higher than an energy level of a valence band constituted by the O2p in an oxide semiconductor. Thus, the nitride semiconductor or oxynitride semiconductor makes it possible to reduce a width of a band gap, i.e., to expand a wavelength range of light that is absorbed. Accordingly, with the semiconductor electrode according to the fourth aspect, the photocurrent value can be improved.

A fifth aspect may be, for example, the semiconductor electrode according to the fourth aspect in which the semiconductor layer is formed of a nitride semiconductor, and the nitride semiconductor is a nitride semiconductor of a transition metal selected from the group consisting of vanadium, niobium and tantalum.

In a semiconductor electrode according to the fifth aspect, the semiconductor layer is formed of a nitride semiconductor of a transition metal selected from vanadium, niobium and tantalum. When the semiconductor forms ions having a maximum valence of a transition metal selected from vanadium, niobium and tantalum, a conduction band in the semiconductor is positioned at an upper end of an oxidation-reduction level of water, i.e., positioned at a level slightly lower than a hydrogen generation level. Thus, the semiconductor electrode according to the fifth aspect makes it possible to ensure that oxidation reaction of water easily proceeds. Specifically, when water splitting reaction using sunlight is carried out by use of one semiconductor, it is preferred that a band gap of the semiconductor is theoretically not less than about 1.8 eV and not more than about 2.4 eV inclusive, and bands are positioned so as to sandwich the oxidation-reduction level of water. Here, when an oxygen overvoltage of about 0.6 V to 0.7 V, which is necessary in four-electron oxidation of water, is considered, it is more preferred that the conduction band is positioned at a level slightly lower than the hydrogen generation level, and the valence band is positioned at a level higher than an oxygen generation level by 0.6 V to not less than 0.7 V. This is because in determination of a band gap in a material, a larger oxygen overvoltage can be secured as the conduction band is positioned closer to the hydrogen generation level. Thus, since the conduction band in the nitride semiconductor of a transition metal selected from vanadium, niobium and tantalum is positioned at a level slightly lower than the hydrogen generation level, reaction of water proceeds more easily.

A sixth aspect may be, for example, the semiconductor electrode according to the fifth aspect in which the nitride semiconductor is a niobium nitride semiconductor.

When the semiconductor is a niobium nitride semiconductor, the semiconductor is capable of utilizing light having a wavelength in a visible light range, and capable of functioning as a visible light-responsive photocatalyst suitable for water split in which the conduction band and the valence band are positioned so as to sandwich the oxidation-reduction level of water. Thus, with a semiconductor electrode according to the sixth aspect, incident light energy can be effectively utilized for water splitting reaction when sunlight or the like is used as a light source.

A seventh aspect may be, for example, the semiconductor electrode according to the fourth aspect in which the semiconductor layer is formed of an oxynitride semiconductor, and the oxynitride semiconductor is an oxynitride semiconductor of a transition metal selected from the group consisting of vanadium, niobium and tantalum.

In a semiconductor electrode according to the seventh aspect, the semiconductor layer is formed of an oxynitride semiconductor of a transition metal selected from vanadium, niobium and tantalum. In the semiconductor electrode according to the seventh aspect, an effect similar to that of the semiconductor electrode according to the fifth aspect can be obtained.

An eighth aspect may be, for example, the semiconductor electrode according to the seventh aspect in which the oxynitride semiconductor is a niobium oxynitride semiconductor.

Even when the semiconductor is formed of niobium oxynitride rather than niobium nitride, an effect similar to that of the sixth aspect can be obtained.

A gas generation device according to a ninth aspect of the present disclosure includes:
 a semiconductor electrode including:
  a conductive substrate;
  a semiconductor layer which is provided on the conductive substrate, and absorbs visible light; and
  a protection layer with which the semiconductor layer is coated,
 wherein
  the protection layer is formed of an oxynitride,
  the visible light travels through the protection layer, and
  the protection layer has a thinner thickness than the semiconductor layer,
 a counter electrode connected electrically with the conductive substrate;
 an electrolyte aqueous solution in contact with the semiconductor electrode and the counter electrode; and
 a container in which the semiconductor electrode, the counter electrode, and the electrolyte aqueous solution are contained.

The device according to the ninth aspect includes the semiconductor electrode according to the above-mentioned aspect. As described above, the semiconductor electrode according to the above-mentioned aspect can be inhibited from suffering degradation of performance with elapse of use time when used while being in contact with water. Thus, the device according to the ninth aspect is capable of improving hydrogen generation efficiency by water splitting reaction.

A fabrication method of a semiconductor electrode according to a tenth aspect of the present disclosure includes:

(a) forming a semiconductor layer which absorbs visible light on a conductive substrate;

(b) coating the semiconductor layer with an oxide layer; and (c) treating the oxide layer with plasma of a gas containing nitrogen to convert the oxide layer into an oxynitride layer which is formed of an oxynitride and through which the visible light travels.

In the semiconductor electrode obtained by the fabrication method according to the tenth aspect, the semiconductor layer is coated with the oxynitride layer. Thus, in the semiconductor electrode obtained by the fabrication method according to the tenth aspect, the semiconductor layer can be prevented from coming into direct contact with water in a water splitting process by sunlight, and therefore degradation of a semiconductor by chemical oxidation can be prevented. The oxynitride layer with which the semiconductor layer is coated is stable to water, and has a lower potential barrier as compared to a layer including only an oxide. Thus, the oxynitride layer formed by the fabrication method according to the tenth aspect is capable of protecting a surface of the semiconductor layer without impairing water splitting characteristics of a semiconductor.

An eleventh aspect may be, for example, the fabrication method according to the tenth aspect in which the semiconductor layer is formed of one selected from the group consisting of a nitride semiconductor and an oxynitride semiconductor.

A twelfth aspect may be, for example, the fabrication method according to the eleventh aspect in which the semiconductor layer is formed of a nitride semiconductor, and the nitride semiconductor is a nitride semiconductor of a transition metal selected from the group consisting of vanadium, niobium and tantalum.

A thirteenth aspect may be, for example, the fabrication method according to the twelfth aspect in which the nitride semiconductor is a niobium nitride semiconductor.

A fourteenth aspect may be, for example, the fabrication method according to the eleventh aspect in which the semiconductor layer is formed of an oxynitride semiconductor, and the oxynitride semiconductor is an oxynitride semiconductor of a transition metal selected from the group consisting of vanadium, niobium and tantalum.

A fifteenth aspect may be, for example, the fabrication method according to the fourteenth aspect in which the oxynitride semiconductor is a niobium oxynitride semiconductor.

In the semiconductor electrode fabricated by the fabrication method according to any one of the eleventh to fifteenth aspects, the semiconductor layer is formed of a nitride semiconductor or an oxynitride semiconductor. A valence band in a nitride semiconductor or oxynitride semiconductor is constituted by an N2p orbit level. The N2p orbit level is closer to an oxidized level of water than an O2p orbit. In other words, an energy level of the valence band in the nitride semiconductor or oxynitride semiconductor is higher than an energy level of a valence band constituted by the O2p in an oxide semiconductor. Thus, the nitride semiconductor or oxynitride semiconductor makes it possible to reduce a width of a band gap, i.e., to expand a wavelength range of light that is absorbed. Accordingly, with the semiconductor electrode fabricated by the fabrication method according to any one of the eleventh to fifteenth aspects, the photocurrent value can be improved.

A sixteenth aspect may be, for example, the fabrication method according to the eleventh aspect in which in the step (c), the treatment increases a nitrogen concentration of a part of the semiconductor layer near the oxide layer.

In the fabrication method according to the sixteenth aspect, an oxide layer with which the semiconductor layer is coated is formed, and the oxide layer is then treated with plasma of a gas containing nitrogen to form an oxynitride layer from the oxide layer. The semiconductor electrode has a region (oxygen-rich layer) in which an oxygen concentration of a surface of the semiconductor layer is higher as compared to other regions in the semiconductor layer due to, for example, contact with oxygen during a fabrication process. In other words, defects such as an oxygen-rich layer may be formed on the surface of the semiconductor layer. As used herein, the surface of the semiconductor layer refers to, among surfaces of the semiconductor layer, a surface on a side opposite to a surface on an interface side with the conductive substrate, i.e., a surface on a side on which the oxynitride layer is formed. In the semiconductor electrode fabricated by the fabrication method according to the sixteenth aspect, the semiconductor contained in the semiconductor layer is a nitrogen-containing semiconductor such as a nitride or oxynitride. Thus, the oxygen-rich layer present on the surface of the semiconductor layer is a factor of deteriorating water splitting characteristics of the semiconductor. In the fabrication method according to the sixteenth aspect, the plasma treatment of the oxide layer, which is performed for formation of an oxynitride layer, increases a nitrogen concentration of the surface on the interface side with the oxide layer in the semiconductor layer. Thus, with the fabrication method according to the sixteenth aspect, the plasma treatment performed for forming the oxynitride layer is capable of restoring defects of the surface of the semiconductor layer concurrently with formation of the oxynitride layer even if defects such as an oxygen-rich layer are generated on the surface of the semiconductor layer.

A seventeenth aspect may be, for example, the fabrication method according to any one of the tenth to sixteenth aspects in which the plasma is generated by applying a high frequency voltage having a frequency band of not less than 30 MHz and not more than 300 MHz to a gas.

In the fabrication method according to the seventeenth aspect, nitrogen-containing plasma generated at a frequency in a VHF band is used for plasma treatment. Such plasma has a high collision frequency of atoms and molecules in the plasma. Thus, kinetic energy of charged particles decreases, and a difference between a plasma potential and a substrate surface potential, i.e., a sheath potential decreases, so that a self bias voltage can be reduced. Accordingly, influences of ion impact can be suppressed, so that deterioration of film quality of an outermost surface of an oxynitride layer formed, i.e., generation of defects can be suppressed. Here, the self bias voltage is as follows. In plasma generated by use of a high frequency, a high-frequency current is fed through an electrode to change a direction of an electric field in a very short period. At this time, ions present in plasma and having a relatively large mass cannot follow the electric field change, while electrons in plasma follow an external electric field to reach the electrode at a high speed, and are negatively charged. As a result, a direct-current negative bias potential, i.e., a self bias voltage is generated near the electrode. By an electric field resulting from a self bias of the electrode, ions are accelerated to collide against the electrode having a negative bias potential, and give ion impact. This is one of factors of generating defects.

An eighteenth aspect may be, for example, the fabrication method according to the tenth to seventeenth aspects in which the gas has an oxygen partial pressure of not more than 0.1%.

With the fabrication method according to the eighteenth aspect, a nitriding reaction rate can be controlled, so that it is easy to attain a desired composition in the oxynitride layer. Specifically, when a plasma treatment is performed with a gas containing only nitrogen, metal ions among constituent ions of an oxide in the oxide layer may be reduced to secure stability. When oxygen is present in a plasma gas, reduction reaction can be suppressed. However, when an amount of oxygen exceeds a certain amount, an oxidation reaction rate is higher than a nitriding reaction rate, i.e., reverse reaction is dominant, because oxygen has an electronegativity larger than an electronegativity of nitrogen, and free energy of formation of an oxide is relatively stable as compared to free energy of formation of a nitride. Thus, nitriding reaction may hardly proceed. In contrast, when a gas with oxygen constituting not more than 0.1% of a total pressure is used, the nitriding reaction rate is higher than the reverse reaction rate, i.e., the oxidation reaction rate, so that nitriding reaction can be made to slowly proceed as a whole, i.e., nitriding reaction can be properly controlled.

A nineteenth aspect may be, for example, the fabrication method according to the tenth to eighteenth aspects in which the gas has a rotation temperature of not less than 480 Kelvin and not more than 1,100 Kelvin.

First, the "rotation temperature" will now be described. The "rotation temperature" is an index showing a magnitude of rotational energy in a degree of freedom of a molecule around a center of gravity of an atomic nucleus. The rotation temperature is in equilibrium with a translation temperature, i.e. a kinetic temperature due to collision with neutral molecules and excited molecules in a pressure range near atmospheric pressure. Thus, the rotation temperature of a $N_2$ molecule can be generally considered as a gas temperature. Thus, the gas temperature can be determined by analyzing light emission of a nitrogen plasma, and measuring the rotation temperature. Specifically, the rotation temperature of the $N_2$ molecule can be calculated by, for example, analyzing a light emission spectrum generated in electron transition from a $C^3\Pi_u$ level to $B^3\Pi_g$ level, the light emission spectrum being called a 2nd positive system that is one light emission spectrum belonging to a light emission spectrum group of the $N_2$ molecule. The electron transition is caused by transition from a rotational level in various vibrational levels within a certain electron level to a rotational level or a vibrational level in other electron level. Assuming that electrons existing at the rotational level in the $C^3\Pi_u$ level and the $B^3\Pi_g$ level are Boltzmann-distributed, a light emission spectrum in a certain vibrational level depends on the rotation temperature. Accordingly, the rotation temperature of the $N_2$ molecule can be determined by comparing a measured spectrum with a calculated spectrum calculated from a theoretical value. The rotation temperature can be determined by, for example, measuring a light emission spectrum (0,2) band of $N_2$ which is observed near a wavelength of 380.4 nm. The (0,2) band is a vibrational band in electron transition, and indicates that a vibrational quantum number at the $C^3\Pi_u$ level being an upper level is 0, and the vibrational quantum number at the $B^3\Pi_g$ level being a lower level is 2. Specifically, a distribution of light emission intensities in a certain vibrational band depends on the rotation temperature. For example, a relative intensity on a shorter wavelength side from a wavelength of 380.4 nm increases as the rotation temperature rises.

In a manufacturing method according to the nineteenth aspect, a chemical reaction rate at which an oxide as a starting material is nitrided can be controlled by setting the rotation temperature used in the plasma treatment to 480 K to 1100 K. Specifically, the chemical reaction rate depends on a reaction rate constant, and the reaction rate constant k is a function dependent on a temperature in accordance with Arrhenius' equation k=Aexp ($-E_a$/RT) (A: frequency factor, $E_a$: activation energy, R: gas constant, T: temperature). Thus, by controlling the temperature, a thickness of the resulting nitride or oxynitride can be controlled.

A twentieth aspect may be, for example, the fabrication method according to any one of the tenth to nineteenth aspects in which in the step (c), the plasma is generated by applying a voltage between a pair of electrodes, one electrode of the pair of electrodes has a surface formed of stainless steel (hereinafter, referred to as "SUS"), in the step (a), the conductive substrate is disposed on a surface of the one electrode of the pair of electrodes, and the surface of the one electrode of the pair of electrodes faces the other electrode of the pair of electrodes.

With the fabrication method according to the twentieth aspect, the electrode with the conductive substrate disposed on a surface of the electrode is formed of SUS that is a material which hardly captures oxygen. Accordingly, oxygen is hardly captured by a holding electrode, and further, deviation of a plasma composition distribution due to release of captured oxygen hardly occurs. Accordingly, stability of treatment with plasma is improved, resulting in improvement of stability in fabrication of a semiconductor electrode.

A method according to a twenty-first aspect of the present disclosure is a method for generating hydrogen, the method including:
 (a) preparing a hydrogen production device, including:
  (i) a semiconductor electrode including:
   a conductive substrate;
   a semiconductor layer which is provided on the conductive substrate, and absorbs visible light; and
   a protection layer with which the semiconductor layer is coated,
  wherein
   the protection layer is formed of an oxynitride,
   the visible light travels through the protection layer, and
   the protection layer has a thinner thickness than the semiconductor layer,
  (ii) a counter electrode connected electrically with the conductive substrate of the semiconductor electrode;
  (iii) an electrolyte aqueous solution in contact with the semiconductor electrode and the counter electrode; and
  (iv) a container in which the semiconductor electrode, the counter electrode, and the electrolyte aqueous solution are contained, and
 (b) irradiating the semiconductor electrode with light to generate hydrogen by splitting water molecules contained in the electrolyte aqueous solution on a surface of the counter electrode.

In the method according to the twenty-first aspect, the semiconductor electrode according to the above-mentioned aspect is used. As described above, the semiconductor electrode according to the above-mentioned aspect can be inhibited from suffering degradation of performance with elapse of use time when used while being in contact with water. Thus, the method according to the twenty-first aspect is capable of improving hydrogen generation efficiency by water splitting reaction.

A twenty-second aspect may be, for example, the method according to the twenty-first aspect in which the oxynitride forming the protection layer is an oxynitride of at least one element selected from the group consisting of aluminum, silicon, and zirconium.

In a method according to the twenty-second aspect, the protection layer formed of the oxynitride is excellent in function of protecting a surface of the semiconductor layer without impairing water splitting characteristics of a semiconductor. Thus, with the method according to the twenty-second aspect, a photocurrent value in water splitting reaction can be improved.

A twenty-third aspect may be, for example, the method according to the twenty-second aspect in which the oxynitride forming the protection layer is an aluminum oxynitride.

In a method according to the twenty-third aspect, the protection layer formed of the oxynitride is excellent in function of protecting a surface of the semiconductor layer without impairing water splitting characteristics of a semiconductor. Thus, with the method according to the twenty-third aspect, the photocurrent value in water splitting reaction can be improved.

A twenty-fourth aspect may be, for example, the method according to any one of the twenty-first to twenty-third aspects in which the semiconductor layer is formed of one selected from the group consisting of a nitride semiconductor and an oxynitride semiconductor.

In a method according to the twenty-fourth aspect, a semiconductor contained in the semiconductor layer is a nitride semiconductor or an oxynitride semiconductor. A valence band in a nitride semiconductor or oxynitride semiconductor is constituted by an N2p orbit level. The N2p orbit level is closer to an oxidized level of water than an O2p orbit. In other words, an energy level of the valence band in the nitride semiconductor or oxynitride semiconductor is higher than an energy level of a valence band constituted by the O2p in an oxide semiconductor. Thus, the nitride semiconductor or oxynitride semiconductor makes it possible to reduce a width of a band gap, i.e., to expand a wavelength range of light that is absorbed. Accordingly, with the method according to the twenty-fourth aspect, the photocurrent value can be improved.

A twenty-fifth aspect may be, for example, the method according to the twenty-fourth aspect in which the semiconductor layer is formed of a nitride semiconductor, and the nitride semiconductor is a nitride semiconductor of a transition metal selected from the group consisting of vanadium, niobium and tantalum.

In a method according to the twenty-fifth aspect, the semiconductor layer is formed of a nitride semiconductor of a transition metal selected from vanadium, niobium and tantalum. When the semiconductor forms ions having a maximum valence of a transition metal selected from vanadium, niobium and tantalum, a conduction band in the semiconductor is positioned at an upper end of an oxidation-reduction level of water, i.e., positioned at a level slightly lower than a hydrogen generation level. Thus, the method according to the twenty-fifth aspect makes it possible to ensure that oxidation reaction of water easily proceeds. Specifically, when water splitting reaction using sunlight is carried out by use of one semiconductor, it is preferred that a band gap of the semiconductor is theoretically not less than about 1.8 eV and not more than about 2.4 eV inclusive, and bands are positioned so as to sandwich the oxidation-reduction level of water. Here, when an oxygen overvoltage of about 0.6 V to 0.7 V, which is necessary in four-electron oxidation of water, is considered, it is more preferred that the conduction band is positioned at a level slightly lower than the hydrogen generation level, and the valence band is positioned at a level higher than an oxygen generation level by 0.6 V to not less than 0.7 V. This is because in determination of a band gap in a material, a larger oxygen overvoltage can be secured as the conduction band is positioned closer to the hydrogen generation level. Thus, since the conduction band in the nitride semiconductor of a transition metal selected from vanadium, niobium and tantalum is positioned at a level slightly lower than the hydrogen generation level, reaction of water proceeds more easily.

A twenty-sixth aspect may be, for example, the method according to the twenty-fifth aspect in which the nitride semiconductor is a niobium nitride semiconductor.

When the semiconductor is a niobium nitride semiconductor, the semiconductor is capable of utilizing light having a wavelength in a visible light range, and capable of functioning as a visible light-responsive photocatalyst suitable for water split in which the conduction band and the valence band are positioned so as to sandwich the oxidation-reduction level of water. Thus, with a method according to the twenty-sixth aspect, incident light energy can be effectively utilized for water splitting reaction when sunlight or the like is used as a light source.

A twenty-seventh aspect may be, for example, the method according to the twenty-fourth aspect in which the semiconductor layer is formed of an oxynitride semiconductor, and the oxynitride semiconductor is an oxynitride semiconductor of a transition metal selected from the group consisting of vanadium, niobium and tantalum.

In a method according to the twenty-seventh aspect, the semiconductor layer is formed of an oxynitride semiconductor of a transition metal selected from vanadium, niobium and tantalum. In the method according to the twenty-seventh aspect, an effect similar to that of the method according to the twenty-fifth aspect can be obtained.

A twenty-eighth aspect may be, for example, the method according to the twenty-seventh aspect in which the oxynitride semiconductor is a niobium oxynitride semiconductor.

Even when the semiconductor is a niobium-containing oxynitride rather than a niobium-containing nitride, an effect similar to that of the twenty-sixth aspect can be obtained.

EMBODIMENTS

First Embodiment

Hereinafter, a method for manufacturing a semiconductor according to one embodiment of the present disclosure will be described with reference to drawings. In the drawings, respective constituent elements are schematically shown for easy understanding, and shapes etc. are not correctly depicted. Values, materials, constituent elements, positions of constituent elements, and so on, which are shown in the following embodiment, are illustrative, and are not intended to limit the method for manufacturing a semiconductor according to the present disclosure. Among constituent elements in the following embodiment, constituent elements which are not described in the manufacturing method according to the first aspect which is a highest-order concept of the present disclosure will be described as optional constituent elements that form a more preferred configuration.

FIG. 1 shows a sectional view of one example of a semiconductor electrode according to this embodiment. Semiconductor electrode 100 shown in FIG. 1 includes conductive substrate 101, semiconductor layer 102 and protection layer 103. Semiconductor layer 102 is provided on conductive substrate 101, and absorbs visible light. Semiconductor layer 102 is coated with protection layer 103. Protection layer 103 contains an oxynitride. Visible light travels through protection layer 103. Protection layer 103 has a thinner thickness than semiconductor layer 102. Hereinafter, a detailed description will be given for each configuration.

A configuration of conductive substrate 101 is not limited as long as conductive substrate 101 is electrically conductive. As conductive substrate 101, a substrate formed of an electrically conductive material, or a substrate with an electrically conductive film provided on a surface of the substrate can be used. Examples of the substrate formed of an electrically conductive material include metal substrates and electrically conductive single-crystal substrates. Examples of the electrically conductive single-crystal substrate include Nb—$TiO_2$ (101) substrates. Examples of the substrate with an electrically conductive film provided on a surface of the substrate include substrates with an electrically conductive film provided on a surface of an insulating substrate such as a glass substrate or a sapphire substrate. The electrically conductive film may be a transparent electrically conductive film of ITO (indium-tin oxide), FTO (fluorine-doped tin oxide) or the like. As for a shape of the substrate, the substrate is not limited to a plate-shaped body (substrate), and may be a three-dimensional structure (three-dimensional structure substrate). Whether or not the substrate and the electrically conductive film are made to have a light-transmissive property may be appropriately determined according to, for example, a configuration of a device to which semiconductor electrode 100 is applied. For example, when semiconductor electrode 100 is disposed in such a direction that a surface on a protection layer 103 side with respect to semiconductor layer 102 forms a light-receiving surface, conductive substrate 101 may have a light-transmissive property, or may have no a light-transmissive property. When semiconductor electrode 100 is disposed in such a direction that a surface on a conductive substrate 101 side with respect to semiconductor layer 102 forms a light-receiving surface, conductive substrate 101 is required to have a light-transmissive property.

Semiconductor layer 102 absorbs visible light. That is, semiconductor layer 102 contains a semiconductor that absorbs visible light. The semiconductor contained in semiconductor layer 102 is not necessarily required to be a single-phase semiconductor, and may be a composite including a plurality of semiconductors. The semiconductor contained in semiconductor layer 102 may carry a metal or the like which functions as a co-catalyst.

It is preferred that semiconductor layer 102 is formed of a nitride semiconductor or an oxynitride semiconductor. Most of semiconductors (e.g., nitride semiconductor or oxynitride semiconductor) containing nitrogen can absorb light in a wider wavelength range as compared to oxide semiconductors. Thus, when semiconductor layer 102 contains a nitride semiconductor or an oxynitride semiconductor, semiconductor electrode 100 is capable of improving a photocurrent value. Details of a reason why a nitride semiconductor or an oxynitride semiconductor can absorb light in a wider wavelength range as compared to an oxide semiconductor are as described for the semiconductor electrode according to the fourth aspect.

The nitride semiconductor or oxynitride semiconductor may be a nitride semiconductor or oxynitride semiconductor of a transition metal selected from vanadium, niobium and tantalum. A conduction band in the nitride semiconductor or oxynitride semiconductor of a transition metal selected from vanadium, niobium and tantalum is positioned at a level slightly lower than a hydrogen generation level, so that oxidation reaction of water proceeds more easily. Details of a reason why the nitride semiconductor or oxynitride semiconductor of a transition metal selected from vanadium, niobium and tantalum ensures that oxidation reaction of water easily proceeds are as described for the semiconductor electrode according to the fifth aspect.

Examples of the nitride semiconductor or oxynitride semiconductor of a transition metal selected from vanadium, niobium and tantalum include niobium nitride semiconductors and niobium oxynitride semiconductors. When the semiconductor is a niobium nitride semiconductor or niobium oxynitride semiconductor, the semiconductor is capable of utilizing light having a wavelength in a visible light range, and capable of functioning as a visible light-responsive photocatalyst suitable for water splitting in which the conduction band and the valence band are positioned so as to sandwich the oxidation-reduction level of water. Thus, semiconductor layer 102 containing a niobium nitride semiconductor or niobium oxynitride semiconductor as a semiconductor is capable of effectively utilizing incident light energy for water splitting reaction when sunlight or the like is used as a light source.

A thickness of semiconductor layer 102 is not particularly limited. However, it is preferred that the thickness of semiconductor layer 102 is, for example, not less than 20 nanometers and not more than 100 nanometers for sufficiently absorbing light, and preventing recombination of carriers generated when the semiconductor is irradiated with light.

A shape and structure of semiconductor layer 102 are not limited to the shape and structure shown in FIG. 1 as long as semiconductor layer 102 is provided in a layered form on conductive substrate 101. For example, semiconductor layer 102 may have a porous structure including a skeleton having a three-dimensionally continuous semiconductor, and pores formed by the skeleton. When conductive substrate 101 is a substrate with an electrically conductive film provided on a surface of the substrate, semiconductor layer 102 is provided on the electrically conductive film.

Semiconductor layer 102 is coated with protection layer 103. Since a surface of semiconductor layer 102 is coated with protection layer 103, semiconductor layer 102 is not in direct contact with water when semiconductor electrode 100 is used for water splitting. Thus, protection layer 103 prevents degradation of the semiconductor in semiconductor layer 101 by chemical oxidation. Protection layer 103 is formed of an oxynitride. In other words, protection layer 103 contains an oxynitride as a main component. Protection layer 103 may contain components other than an oxynitride as long as the semiconductor electrode is inhibited from suffering deterioration of performance with elapse of use time when used while being in contact with water. Protection layer 103 formed of an oxynitride is stable to water, and a potential barrier of the protection layer can be made lower than that of a protection layer including only an oxide. Thus, protection layer 103 is capable of protecting the surface of semiconductor layer 102 without impairing water splitting characteristics of the semiconductor in semiconductor layer 102. Since visible light travels through protection layer 103, visible light applied to semiconductor electrode 100 can be preferentially absorbed in semiconductor layer 102. That is, in semiconductor electrode 100, a considerable reduction in amount of light absorbed in semiconductor layer 102 due to absorption of light in protection layer 103 does not occur. Thus, semiconductor electrode 100 is capable of suppressing deterioration of charge separation efficiency of semiconductor layer 102.

As described above, semiconductor electrode 100 includes protection layer 103, and therefore can be inhibited from suffering deterioration of performance with elapse of use time when used while being in contact with water.

The oxynitride that forms protection layer 103 may be, for example, an oxynitride of at least one element selected from the group consisting of aluminum, silicon and zirconium. Visible light can sufficiently travel through aluminum oxynitride, silicon oxynitride and zirconium oxynitride, and these oxynitrides are sufficiently stable to water, and have a low potential barrier. That is, these oxynitrides are excellent in function of protecting the surface of semiconductor layer 102 without impairing water splitting characteristics of the semiconductor. Thus, protection layer 103 containing at least one of these oxynitrides can further improve a photocurrent value in water splitting reaction.

It is preferred that protection layer 103 is formed of aluminum oxynitride among the three oxynitrides described above. The aluminum oxynitride is particularly excellent in function of protecting the surface of semiconductor layer 102 without impairing water splitting characteristics of the semiconductor. Thus, protection layer 103 formed of aluminum oxynitride is capable of further improving a photocurrent value in water splitting reaction. The aluminum oxynitride here means an oxynitride containing an aluminum element, and is represented by composition formula: $AlO_xN_y$. In this composition formula, for example, x may be not less than 0 and not more than 1.5, and y may be not less than 0 and not more than 1. The aluminum oxynitride may be, for example, AlON.

A thickness of protection layer 103 is not particularly limited as long as the thickness of protection layer 103 has a thinner thickness than semiconductor layer 102. However, for ensuring that semiconductor electrode 100 causes water splitting reaction, carriers that are charge-separated by the semiconductor contained in semiconductor layer 102 should tunnel through protection layer 103 to reach a surface of protection layer 103. According to theoretical calculation of a stepping potential barrier, a tunneling probability of minor carriers decreases depending on a thickness of the barrier, i.e., the thickness of protection layer 103 herein, as shown in the theoretical formula (1). Thus, for increasing the tunneling probability of carriers, it is preferred that protection layer 103 is thinner. Meanwhile, for protecting semiconductor layer 102, protection layer 103 is required to have such a thickness that semiconductor layer 102 can be sufficiently protected. The thickness of protection layer 103, which is suitable for increasing the tunneling probability of carries and sufficiently protecting semiconductor layer 102, varies depending on a material of protection layer 103 and the semiconductor contained in semiconductor layer 102. Thus, the thickness of protection layer 103 may be appropriately adjusted with consideration given to the semiconductor that forms semiconductor layer 102, the material of protection layer 103, and so on.

For example, when semiconductor layer 102 is formed of niobium oxynitride (e.g., NbON) as a semiconductor, and protection layer 103 is formed of aluminum oxynitride, the thickness of protection layer 103 is preferably 10 nanometers or less, more preferably 5 nanometers or less, still more preferably 3 nanometers or less. Protection layer 103 may be an extremely thin film having a thickness of about 1 nanometer. When semiconductor layer 102 is formed of niobium oxynitride as a semiconductor, the tunneling probability of carriers through protection layer 103 can be increased by setting the thickness of protection layer 103 within the above-mentioned range. As a result, a reduction in photovoltaic power due to presence of protection layer 103 is suppressed. However, when the thickness of the protection layer 103 is less than 0.5 nanometers, it is difficult that a film is formed in a conformal manner and semiconductor layer 102 is coated with this film. Thus, the thickness of protection layer 103 is preferably not less than 0.5 nanometers.

One example of the fabrication method of a semiconductor electrode according to this embodiment will now be described.

The fabrication method of a semiconductor electrode according to this embodiment includes:

(a) forming a semiconductor layer which absorbs visible light on a conductive substrate;

(b) coating the semiconductor layer with an oxide layer; and (c) treating the oxide layer with plasma of a gas containing nitrogen to convert the oxide layer into an oxynitride layer which is formed of an oxynitride and through which the visible light travels.

First, one example of a plasma generating apparatus usable in a plasma treatment in the fabrication method according to this embodiment will be described with reference to FIG. 2.

Figure 2:
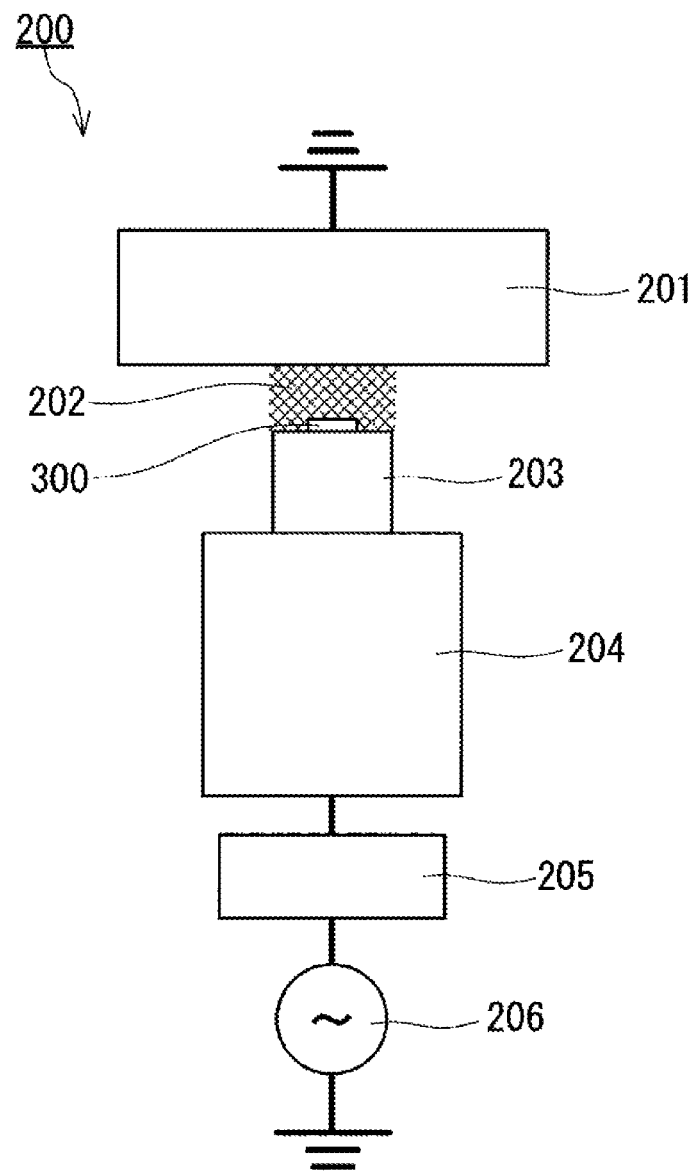
FIG. 2 is a schematic view showing an example of a configuration of a plasma generating apparatus to be used in a fabrication method of a semiconductor electrode according to one embodiment of the present disclosure.

FIG. 2 is a schematic view showing an example of a configuration of the plasma generating apparatus. Plasma generating apparatus 200 includes upper electrode 201, lower electrode (i.e., holding electrode) 203 also serving as a stage, heater 204, matching unit 205, and high-frequency power source 206. Upper electrode 201 is connected to ground. A plasma treatment object is set on lower electrode 203. Heater 204 is installed below lower electrode 203. Matching unit 205 is installed below heater 204. In FIG. 2, reference numeral 202 denotes plasma. FIG. 2 shows a state in which as the plasma treatment object, oxide layer 300 before plasma treatment is set on apparatus 200. Specifically, oxide layer 300 before plasma treatment as shown in FIG. 2 is a laminate including conductive substrate 101, semiconductor layer 102 formed on conductive substrate 101, and oxide layer 300 with which semiconductor layer 102 is coated.

A kind of the plasma is not particularly limited, but use of a non-thermal equilibrium plasma generated by glow discharge is preferred. A thermal equilibrium plasma generated by arc discharge, or the like may also be used.

For generation of the plasma, various kinds of methods and means such as, for example, an inductively coupled plasma method, a microwave plasma method, and electrode methods such as those of parallel-plate type and coaxial type can be used.

As a power source for generating a plasma, a high-frequency power source in a VHF range may be used. By using a plasma in a VHF range, a high plasma density can be achieved, so that a chemical reaction rate can be increased, i.e. a chemical reaction can be accelerated. Thus, a VHF power source may be used as high-frequency power source 206 in plasma generating apparatus 200 shown in FIG. 2.

The plasma generating apparatus to be used in the fabrication method according to this embodiment may have a configuration in which high-frequency power source 206 is installed on upper electrode 201 side rather than a configuration in which high-frequency power source 206 is installed below heater 204 as in plasma generating apparatus 200 shown in FIG. 2.

For upper electrode 201 and lower electrode 203, various metals such as niobium (Nb), tantalum (Ta), aluminum (Al), titanium (Ti), silver (Ag), copper (Cu), silicon (Si), gold (Au), platinum (Pt) and SUS can be used. Since upper electrode 201 and lower electrode 203 are exposed to a plasma, it is preferred that a metal having low corrosiveness, i.e. low reactivity is used for these electrodes. Accordingly, a gas is selectively consumed in upper electrode 201 and lower electrode 203, i.e. a reaction of the gas with the electrode can be prevented from proceeding. The consumed gas component can be prevented from being secondarily volatilized and generated from upper electrode 201 and lower electrode 203 in the treatment. Accordingly, stability of the treatment can be secured without causing deviation of a plasma composition distribution.

For suppressing occurrence of deviation of a plasma composition distribution to improve stability of the plasma treatment, it is preferred that a material which hardly captures oxygen is used for lower electrode 203 that holds a plasma treatment object. The material which hardly captures oxygen is, for example, SUS. Accordingly, oxygen is hardly captured by lower electrode 203, and further, deviation of a plasma composition distribution due to release of captured oxygen hardly occurs, so that stability of a treatment with a plasma is improved, and as a result, stability of manufacturing of a semiconductor is improved.

A material (e.g., Nb) which easily captures oxygen may be used for lower electrode 203. When such a material is used, the electrode captures a part of oxygen in a gas to reduce an oxygen partial pressure of the gas even if the oxygen partial pressure of the gas used in the plasma treatment is somewhat high. Therefore, it is not necessary to perform control under a condition for limiting the oxygen partial pressure in the gas to a very low level, and it becomes easy to manufacture a semiconductor electrode.

A film which is provided on a surface of a conventional member by, for example, a plasma etching apparatus and which has high plasma resistance and corrosion resistance may be formed on each of upper electrode 201 and lower electrode 203. As materials of the film, yttrium oxide ($Y_2O_3$), aluminum oxide ($Al_2O_3$) and the like are known. These films have an effect of suppressing generation of a reaction product due to influences of oxidation and nitriding of electrode members, and an effect of preventing damage to the members by the plasma. Accordingly, a stable plasma treatment can be performed.

Steps in one example of the fabrication method of a semiconductor electrode according to this embodiment will now be described in detail.

Figure 3:
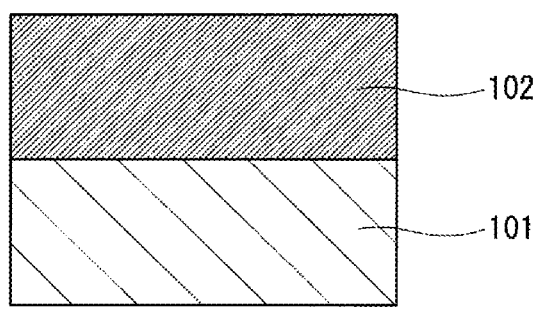
FIG. 3 is a sectional view showing a laminate of a conductive substrate and semiconductor layer in one step in the fabrication method of a semiconductor electrode according to one embodiment of the present disclosure.
Figure 4:
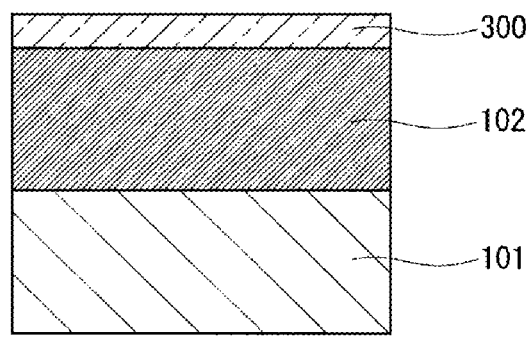
FIG. 4 is a sectional view showing a laminate of a conductive substrate, semiconductor layer and oxide layer in one step in the fabrication method of a semiconductor electrode according to one embodiment of the present disclosure.

FIGS. 3 and 4 are sectional views showing examples of steps for the fabrication method of a semiconductor electrode according to this embodiment. Specifically, FIG. 3 shows a sectional view of a laminate which is obtained in step (a) and which has semiconductor layer 102 formed on conductive substrate 101. FIG. 4 shows a sectional view of a laminate which is obtained in step (b) and which includes conductive substrate 101, semiconductor layer 102 formed on conductive substrate 101, and oxide layer 300 with which semiconductor layer 102 is coated. Oxide layer 300 shown in FIG. 4 is a layer serving as a precursor of an oxynitride layer. That is, oxide layer 300 shown in FIG. 4 is converted into an oxynitride layer by plasma treatment in step (c). The oxynitride layer functions as a protection layer in the semiconductor electrode according to this embodiment. That is, semiconductor electrode 100 shown in FIG. 1 is a semiconductor electrode obtained after plasma treatment in step (c).

First, in step (a), semiconductor layer 102 is formed on conductive substrate 101 (see FIG. 3).

The conductive substrate usable as conductive substrate 101 is as described above.

The semiconductor usable as the semiconductor contained in semiconductor layer 102 is as described above. Here, a case will be described as an example where the semiconductor is formed of niobium oxynitride. Niobium oxynitride can be formed by, for example, a reactive sputtering method in which a niobium oxide target is sputtered in a nitrogen gas atmosphere. Semiconductor layer 102 may be formed by depositing niobium oxynitride in a thickness of, for example, not less than 20 nanometers and not more than 100 nanometers. As a method for depositing semiconductor layer 102, a method other than the reactive sputtering method can be used. For example, semiconductor layer 102 may be formed by a gas phase method such as a molecular beam epitaxy method, a pulse laser deposition method or an organic metal gas phase growth method, or formed by a liquid phase method such as a sol-gel method.

When the niobium oxynitride has composition of $Nb_xO_yN_z$, it is preferred that the niobium oxynitride ideally satisfies a relationship of $x=y=z=1$ (i.e., x:y:z=1:1:1). However, when the niobium oxynitride absorbs visible light, and is shown to have a desired niobium oxynitride single phase by an X-ray diffraction result, the niobium oxynitride may have composition deviated from the above-mentioned composition, i.e., a non-stoichiometric composition.

Next, in step (b), oxide layer 300 is formed as a precursor of the protection layer on semiconductor layer 102 as shown in FIG. 4. Here, a case will be described as an example where oxide layer 300 is formed of aluminum oxide. Oxide layer 300 formed of aluminum oxide can be formed by, for example, depositing aluminum oxide by an atomic layer deposition method with trimethylaluminum (TMA) as a precursor. A thickness of oxide layer 300 is determined according to a thickness of a target oxynitride layer, i.e., the protection layer. The aluminum oxide formed here can be represented by a composition formula of $AlO_x$ where x is not more than 1.5.

The atomic layer deposition method is a thin film formation method in which a raw material gas (precursor gas) and a reactant gas are alternately introduced into a chamber, so that a reaction product is deposited as atomic layers one by one on a surface of a substrate installed in the chamber. As the atomic layer deposition method, for example, a method is known in which plasma is generated in a chamber (plasma ALD method), or a substrate is heated (thermal ALD method) for accelerating reaction, and any of the methods may be employed.

An example of forming a thin film composed of aluminum oxide by use of a plasma ALD method as the atomic layer deposition method will be described in detail. The aluminum oxide can be formed by use of, for example, TMA as a raw material gas, Ar as a purge gas and $O_2$ as a reactant gas. A correlation between a thickness of an oxynitride layer that is finally obtained and a number of aluminum oxide deposition cycles is as follows: a thickness of 1 nanometer, a thickness of 3 nanometers and a thickness of 10 nanometers correspond to 8 cycles, 22 cycles and 73 cycles, respectively. One cycle includes supply of TMA as a raw material gas, purge of TMA, supply of $O_2$ and generation of plasma, and purge of $O_2$ in this order. The thickness of the layer can be easily measured by use of an ellipsometry method. When a target thickness of the oxynitride layer is 1 nanometer, and the number of aluminum oxide deposition cycles is 8, a time of one cycle is about 30 seconds when for example, a TMA supply time is 0.06 seconds, an $O_2$ supply time is 20 seconds, a plasma exposure time is 17 seconds, and each of a TMA exhaust time and an $O_2$ exhaust time is 5 seconds. Thus, a total time taken for deposition in 8 cycles here is about 4 minutes. A time required for a process in one cycle is always constant regardless of the number of cycles. Thus, the number of cycles is proportional to the thickness, and therefore the number of cycles may be changed according to a target thickness. The total time taken for deposition is also changed in proportion to the number of cycles.

As a method for depositing oxide layer 300, a method other than the atomic layer deposition method can be used. Since oxide layer 300 is formed as an extremely thin film, it is difficult to control the thickness. As another method in which the thickness can be controlled, for example, a gas phase method such as a reactive sputtering method, a molecular beam epitaxy method, a pulse laser deposition method or an organic metal gas phase growth method, or a liquid phase method such as a sol-gel method or a dip coating method can be used.

Next, in step (c), oxide layer 300 is subjected to plasma treatment with plasma of a nitrogen-containing gas. By the excited nitrogen plasma gas, oxide layer 303 is nitrided to form an oxynitride layer. The oxynitride layer functions as a protection layer for the semiconductor electrode according to this embodiment. That is, semiconductor electrode 100 shown in FIG. 1 is obtained by plasma treatment in step (c).

The plasma treatment may increase a nitrogen concentration of surface 102a of semiconductor 102 on an interface side with oxide layer 300. When conditions for plasma treatment are appropriately adjusted, nitrogen can be diffused to surface 102a of semiconductor layer 102 by plasma treatment. Surface 102a of semiconductor layer 102 may have an excessively high oxygen concentration, leading to formation of a so called oxygen-rich layer. For example, when the semiconductor that forms semiconductor layer 102 is a nitride or oxynitride, the oxygen-rich layer present on a surface of the semiconductor layer may be a factor of deteriorating water splitting characteristics of the semiconductor. When plasma treatment is capable of increasing the nitrogen concentration of surface 102a of semiconductor layer 102, the plasma treatment can restore defects of the surface of semiconductor layer 102 concurrently with formation of the oxynitride layer even if an oxygen-rich layer is generated on surface 102a of semiconductor layer 102.

The plasma treatment in the fabrication method according to this embodiment may be, for example, treatment with high-frequency plasma in a VHF band. The high-frequency plasma in a VHF band refers to plasma generated in a frequency band of not less than 30 MHz and not more than 300 MHz.

Plasma treatment conditions can be appropriately adjusted according to an oxynitride layer to be formed.

A rotation temperature of a plasma gas in performing plasma treatment may be appropriately selected from a range of not less than 480 K and not more than 1100 K (i.e., not less than 207 degrees Celsius and not more than 827 degrees Celsius).

When a gap width between electrodes is fixed, the rotation temperature of the plasma gas can be controlled by a pressure. For example, when the gap width between electrodes is 8 millimeters, the pressure may be not less than 5 kPa and not more than 15 kPa. When the pressure is more than 15 kPa, nitrogen may be diffused toward semiconductor layer 102 because oxide layer 300 to be subjected to plasma treatment is an extremely thin film. When semiconductor 102 is formed of niobium oxynitride, the niobium oxynitride may be reduced to form trivalent niobium nitride when nitrogen is diffused toward semiconductor layer 102.

When considering chemical equilibrium, the pressure influences a reaction rate. Thus, a treatment time can be selected by controlling the pressure according to a thickness of oxide layer 300.

When the pressure is fixed, the rotation temperature of the plasma gas can be controlled by the gap width between electrodes. For example, when the pressure is 8 kPa, the gap width between electrodes in the plasma generating apparatus may be not less than 5.3 millimeters and not more than 11 millimeters. When the gap width between electrodes is more than 11 millimeters, a gas temperature is further elevated, and nitrogen may be excessively diffused toward semiconductor layer 102 because oxide layer 300 to be subjected to plasma treatment is an extremely thin film. When semiconductor 102 is formed of niobium oxynitride, the niobium oxynitride may be reduced to form trivalent niobium nitride when nitrogen is excessively diffused toward semiconductor layer 102.

When the pressure is fixed, the rotation temperature of the plasma gas can also be controlled by an electric power per area of the plasma generating apparatus. For example, when the pressure is 10 kPa, the electric power per area of the plasma generating apparatus may be not less than 25 W/cm$^2$ and not more than 808 W/cm$^2$. When the electric power per area is more than 808 W/cm$^2$, nitrogen may be diffused toward semiconductor layer 102 because oxide layer 300 to be subjected to plasma treatment is an extremely thin film. When semiconductor 102 is formed of niobium oxynitride, the niobium oxynitride may be reduced to form trivalent niobium nitride when nitrogen is diffused toward semiconductor layer 102.

Lower electrode 203 (see FIG. 2) is not required to be heated. Heating of lower electrode 203 is expected to have an effect of improving diffusion of nitrogen. When a sufficient nitriding ability is exhibited only with a plasma gas temperature, it is possible to perform nitriding treatment without heating lower electrode 203. Thus, apparatus 200 can be simplified.

With regard to the plasma gas, the nitriding ability varies according to, for example, a partial pressure ratio of nitrogen and oxygen, and therefore a relationship between plasma treatment conditions and a nitriding degree is not limited to the relationship described above. A range of each of preferred plasma treatment conditions can be appropriately selected according to, for example, a partial pressure ratio of nitrogen and oxygen in the plasma gas. The nitriding ability also varies depending on magnitudes of the electrode area, the power and so on, and therefore the electrode area, the power and so on are not limited to the conditions described above.

The plasma gas to be used for plasma treatment is preferably a gas containing nitrogen and having an oxygen partial pressure of not more than 0.1% of a total pressure. As the plasma gas, for example, a nitrogen single gas, and a mixed gas of nitrogen-hydrogen, nitrogen-argon or the like can also be used.

The electric power per area in plasma treatment may be, for example, not less than 25 W/cm$^2$ and not more than 808 W/cm$^2$.

Second Embodiment

A device according to a second embodiment of the present disclosure will be described with reference to FIG. 5. FIG.

5 is a schematic view showing one example of a configuration of a hydrogen production device which is a device according to this embodiment. It is preferred that the gas production device is used as a hydrogen production device as described below.

Figure 5:
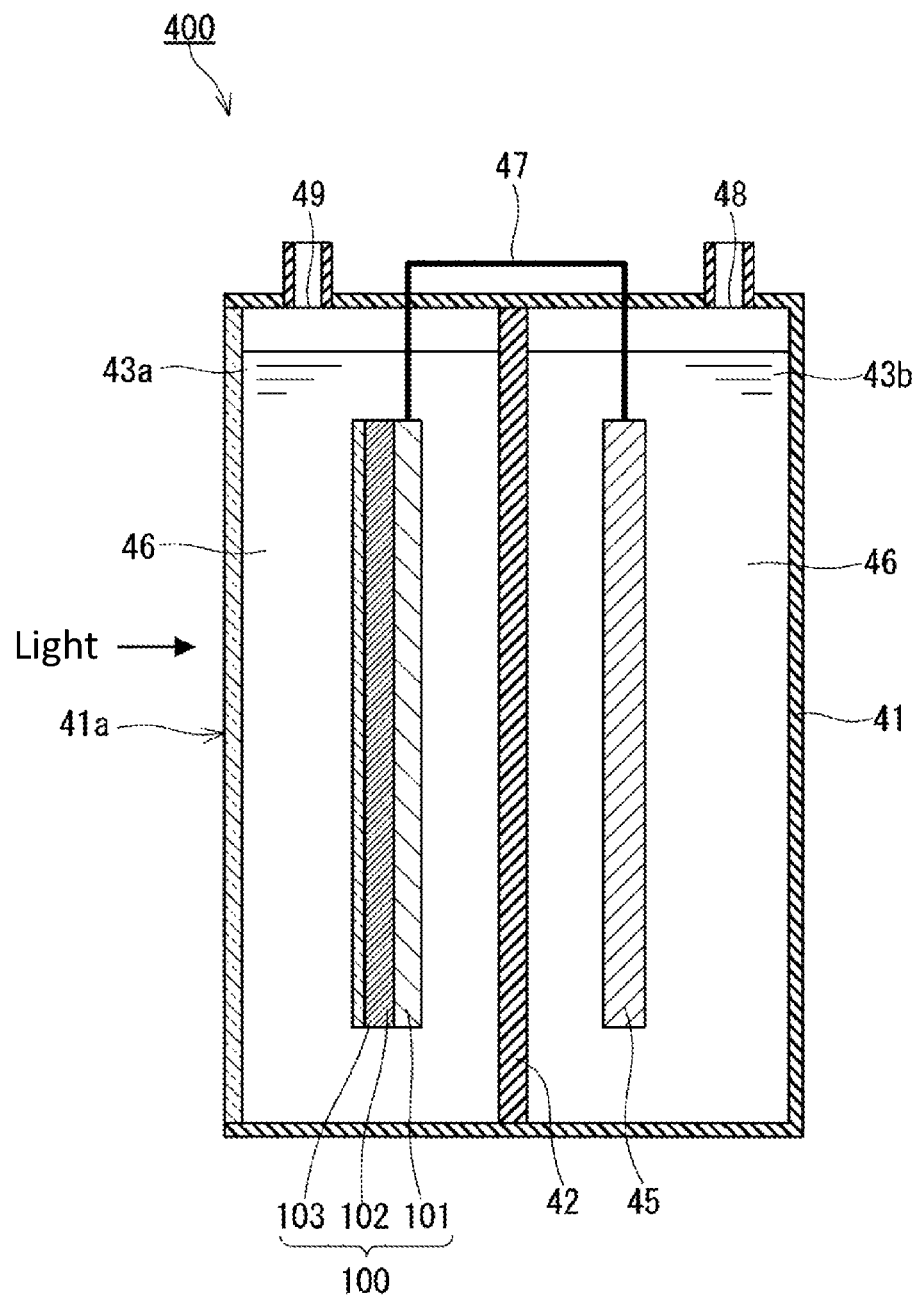
FIG. 5 is a schematic view showing one example of a configuration of a device in which the semiconductor electrode according to one embodiment of the present disclosure is provided as a water splitting electrode.

Hydrogen production device 400 shown in FIG. 5 includes: container 41; separator 42 which separates an internal space of container 41 into first space 43a and second space 43b; semiconductor electrode 100 disposed in first space 43a; counter electrode 45 disposed in second space 43b; and electrolyte solution 46 containing water in first space 43a and second space 43b. Semiconductor electrode 100 and counter electrode 45 are electrically connected to each other by electrical connector 47. Hydrogen production device 400 is further provided with hydrogen gas outlet 48 extending through container 41 and communicating with an inner part of one of first space 43a and second space 43b that is on a hydrogen generation side (inner part of second space 43b in an example shown in FIG. 5). As necessary, hydrogen production device 400 may be provided with oxygen gas outlet 49 extending through container 41 and communicating with an inner part of one of first space 43a and second space 43b that is on an oxygen generation side (inner part of first space 43a in an example shown in FIG. 4).

Components of hydrogen production device 400 will now be described in detail.

Container 41 has light-transmissive surface 41a facing first space 43a. Light-transmissive surface 41a is a surface (photoirradiation surface) of container 41 which is irradiated with light. Preferably, light-transmissive surface 41a is formed of a material which has corrosion resistance and insulation quality to electrolyte solution 46 and through which light a visible light range travels. More preferably, light-transmissive surface 41a is formed of a material through which not only light having a wavelength in a visible light range but also light having a wavelength around the visible light range travels. Examples of the material include glass and resin. A part of container 41 other than light-transmissive surface 41a is only required to have corrosion resistance and insulation quality to electrolyte solution 46, and is not required to have a light-transmissive property. For the part of container 41 other than light-transmissive surface 41a, not only the glass and resin but also metal with a surface subjected to processing for imparting corrosion resistance and insulation can be used.

As described above, separator 42 separates the inner part of container 41 into first space 43a containing semiconductor electrode 100 and second space 43b containing counter electrode 45. Preferably, separator 42 is disposed so as to be substantially parallel to light-transmissive surface 41a being a photoirradiation surface of container 41 as shown in, for example, FIG. 4. Separator 42 plays a role of exchanging ions between electrolyte solution 46 in first space 43a and electrolyte solution 46 in second space 43b. Accordingly, at least a part of separator 42 is in contact with electrolyte solution 46 in first space 43a and in second space 43b. Separator 42 is formed of a material which is permeable to an electrolyte in electrolyte solution 46 and which serves to suppress permeation of an oxygen gas and a hydrogen gas in electrolyte solution 46. A material of separator 42 is, for example, a solid electrolyte such as a high-molecular solid electrolyte. Examples of the high-molecular solid electrolyte include ion exchange membranes such as Nafion (registered trademark). Since the space on the oxygen generation side and the space on the hydrogen generation side in the housing are separated by separator 42, generated oxygen and hydrogen can be collected separately from each other.

Semiconductor electrode 100 is semiconductor (see FIG. 1) described in the first embodiment. Thus, semiconductor electrode 100 includes conductive substrate 101, semiconductor layer 102, and protection layer 103. In an example shown in FIG. 5, semiconductor electrode 100 is disposed in such a direction that a surface of protection layer 103 faces light-transmissive surface 41a of container 41, i.e. a surface of protection layer 103 forms a light-receiving surface. However, semiconductor electrode 100 may be disposed in a direction opposite to the above-mentioned direction. Thus, semiconductor electrode 100 may be disposed in such a direction that a surface of conductive substrate 101 faces light-transmissive surface 41a of container 41, i.e. conductive substrate 101 forms a light-receiving surface. However, when conductive substrate 101 forms a light-receiving surface, conductive substrate 101 is required to have a light-transmissive property.

Semiconductor layer 102 provided on conductive substrate 101 is not necessarily required to be a single-phase semiconductor, and may be a composite composed of a plurality of semiconductors, or may carry a metal etc. serving as a co-catalyst. A mechanism capable of applying a bias voltage may be provided between semiconductor layer 102 and counter electrode 45.

For counter electrode 45, a material active to a hydrogen generation reaction is used when a semiconductor having electrical conductivity and forming semiconductor layer 102 of semiconductor electrode 100 is an n-type semiconductor, and a material active to an oxygen generation reaction is used when the semiconductor is a p-type semiconductor. Examples of the material of counter electrode 45 include carbon and noble metals which are generally used in electrodes for electrolysis of water. Specifically, carbon, platinum, platinum-carried carbon, palladium, iridium, ruthenium, nickel and so on can be employed. A shape of counter electrode 45 is not particularly limited, and an installation position of counter electrode 45 is not particularly limited as long as it is installed in second space 43b. Counter electrode 45 and an inner wall of second space 43b may be in contact with each other, or at a distance from each other.

For electrical connector 47, for example, a general metallic conducting wire can be used.

Electrolyte solution 46 contained in first space 43a and second space 43b may be an electrolyte solution which contains water and in which an electrolyte is dissolved, and electrolyte solution 46 may be acidic, neutral or basic. Examples of the electrolyte include hydrochloric acid, sulfuric acid, nitric acid, potassium chloride, sodium chloride, potassium sulfate, sodium sulfate, sodium hydrogen carbonate, sodium hydroxide, phosphoric acid, sodium dihydrogen phosphate, disodium hydrogen phosphate and sodium phosphate. Electrolyte solution 46 may contain a plurality of the electrolytes.

Operations of hydrogen production device 400 will now be described where the semiconductor contained in semiconductor layer 102 is an n-type semiconductor, i.e. oxygen is generated from semiconductor electrode 100.

In hydrogen production device 400, light which has passed through light-transmissive surface 41a of container 41 and electrolyte solution 46 in first space 43a is incident to semiconductor layer 102 of semiconductor electrode 100. Semiconductor layer 102 absorbs light to cause photoexcitation of electrons, so that in semiconductor layer 102, electrons are generated in a conduction band, and holes are generated in a valence band. Holes generated by photoirradiation move to a surface of semiconductor layer 102 (interface with electrolyte solution 46). The holes oxidize water molecules at the surface of semiconductor layer 102, resulting in generation of oxygen (reaction formula (A) described below). Electrons generated in the conduction band move to conductive substrate 101, and move an electrically conductive part of conductive substrate 101 to counter electrode 45 through electrical connector 47. The electrons move through an inner part of counter electrode 45 to arrive at a surface of counter electrode 45 (interface with electrolyte solution 46), and reduce protons at the surface of counter electrode 45, resulting in generation of hydrogen (reaction formula (B) described below).

$$4h^+ + 2H_2O \rightarrow O_2\uparrow + 4H^+ \quad (A)$$

$$4e^- + 4H^+ \rightarrow 2H_2\uparrow \quad (B)$$

The hydrogen gas generated in second space 43b is collected through hydrogen gas outlet 48 communicating with the inner part of second space 43b.

Hydrogen production device 400 of this embodiment has been described by showing as an example a case where the semiconductor forming semiconductor layer 102 is an n-type semiconductor, and when the semiconductor forming semiconductor layer 102 is a p-type semiconductor, operations of hydrogen production device 400 may be described with oxygen and hydrogen replaced by each other in the foregoing operations where the semiconductor is formed of an n-type semiconductor.

While the embodiments of the present disclosure have been described above, the present disclosure is not limited to the embodiments, and can be refined, changed or modified without departing from a spirit of the present disclosure.

EXAMPLES

The present disclosure will be described further in detail by way of examples. The following examples are illustrative, and the present disclosure is not limited by the following examples.

Inventive Example 1

As a conductive substrate, a Nb—$TiO_2$ (101) conductive single-crystal substrate was used. First, as a semiconductor seed layer, niobium oxynitride (NbON) was formed in a thickness of 20 nanometers on the conductive substrate. Next, as a semiconductor main growth layer, niobium oxynitride (NbON) was successively formed in a thickness of 70 nanometers on the semiconductor seed layer. Specifically, the semiconductor seed layer and the semiconductor main growth layer were formed by use of a reactive sputtering method. As a sputtering target, $Nb_2O_5$ was used. As sputtering conditions for the semiconductor seed layer, sputtering was performed in a mixed atmosphere of oxygen and nitrogen, a substrate temperature was 650 degrees Celsius, and in a chamber, a total pressure was 0.5 Pa, an oxygen partial pressure was 0.017 Pa, and a nitrogen partial pressure was 0.48 Pa. As sputtering conditions for the semiconductor main growth layer, sputtering was performed in a mixed atmosphere of oxygen and nitrogen, a substrate temperature was 500 degrees Celsius, and in a chamber, a total pressure was 0.5 Pa, an oxygen partial pressure was 0.011 Pa, and a nitrogen partial pressure was 0.49 Pa. In this way, a semiconductor layer was formed on the conductive substrate.

Next, as an oxide layer coating the semiconductor layer, aluminum oxide was deposited in a thickness of 1 nanometer on the semiconductor layer by a plasma ALD method as an atomic layer deposition method. Specifically, TMA was used as a raw material gas, Ar was used as a purge gas, $O_2$ was used as a reactant gas, and a number of deposition cycles was 8. One cycle included supply of TMA as a raw material gas, purge of TMA, supply of $O_2$ and generation of plasma, and purge of $O_2$ in this order. In one cycle, a TMA supply time was 0.06 seconds, an $O_2$ supply time was 20 seconds, a plasma exposure time was 17 seconds, and each of a TMA exhaust time and an $O_2$ exhaust time was 5 seconds. A time of one cycle was about 30 seconds. A substrate temperature was 110° C.

Next, by use of plasma apparatus 200 shown in FIG. 2, an oxide layer composed of aluminum oxide was subjected to plasma treatment to obtain an oxynitride layer from the oxide layer. The oxynitride layer functions as a protection layer. An electrode formed of SUS was used as lower electrode 203 of plasma apparatus 200 used in this example. As plasma treatment conditions, a temperature of lower electrode 203 was 358 degrees Celsius, a total pressure was 5 kPa during plasma ignition and 8 kPa during plasma process, a plasma gas was nitrogen gas, a power was 26.7 W/cm², a gap width between electrodes was 10 millimeters, and a treatment time was 1 minute. The plasma treatment performed in this example was treatment with plasma generated at a frequency in a VHF band, and the frequency was 100 MHz. Here, a rotation temperature of the gas was 608 K, i.e., 335 degrees Celsius.

By the above-mentioned method, a semiconductor electrode of Inventive Example 1 was obtained. The semiconductor electrode of Inventive Example 1 had a configuration of aluminum oxynitride layer (protection layer)/niobium oxynitride layer (semiconductor layer)/conductive substrate.

Figure 6A:
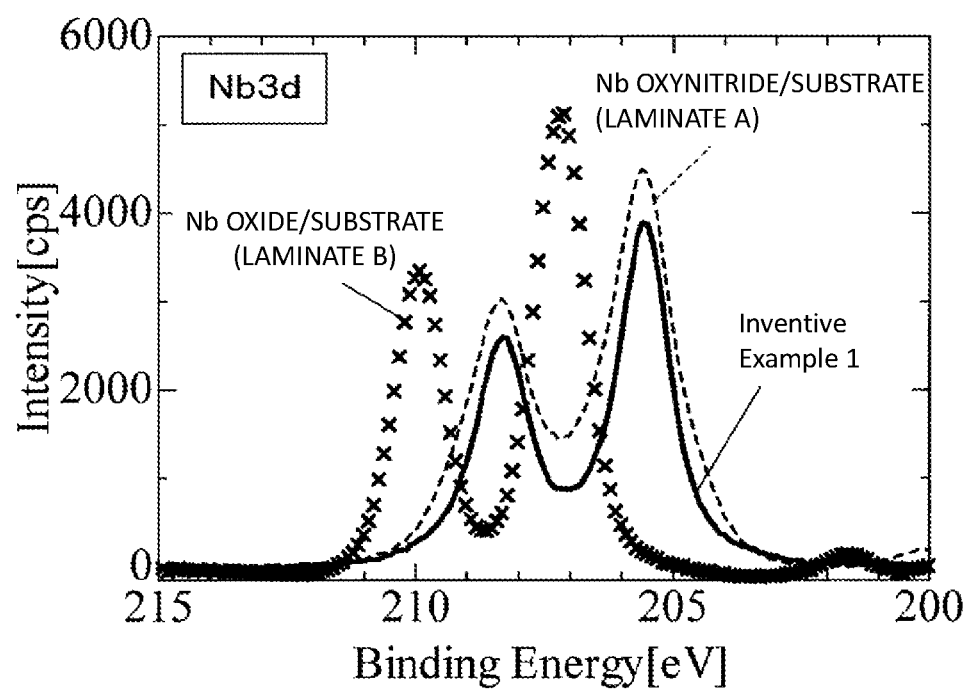
FIG. 6A shows XPS spectra of Nb3d for a semiconductor electrode of Inventive Example 1, and comparative laminates A and B.
Figure 6B:
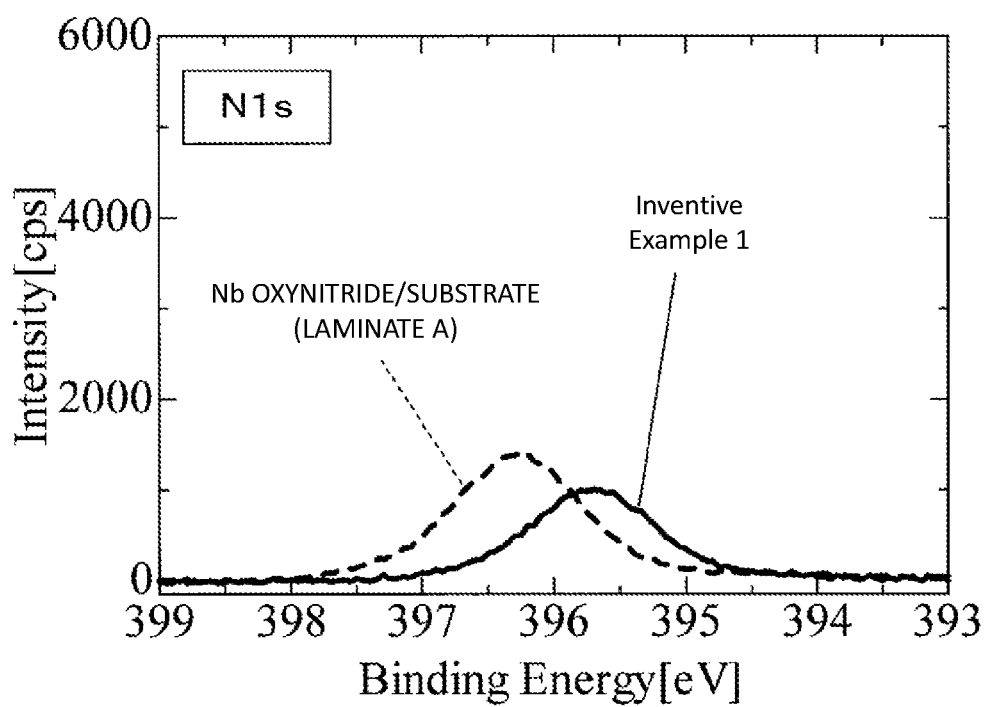
FIG. 6B shows XPS spectra of N1s for the semiconductor electrode of Inventive Example 1, and the comparative laminate A.
Figure 6C:
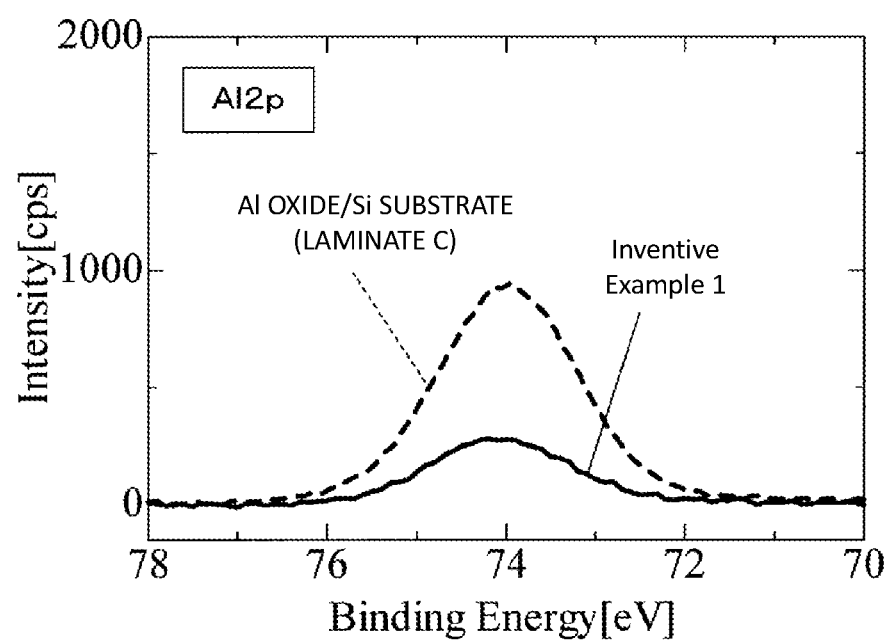
FIG. 6C shows XPS spectra of Al2p for the semiconductor electrode of Inventive Example 1, and a comparative laminate C.

The protection layer of the resulting semiconductor electrode and a bonding state of the protection layer were examined by XPS. FIGS. 6A to 6C show XPS measurement results for Nb3d, N1s and Al2p, respectively. XPS is a method suitable for observation of a bonding state of ions at an outermost surface of a thin film or a bulk in general, and has such a resolution that an element present within a range extending from an outermost surface to a depth of about 5 nanometers or less can be detected.

FIG. 6A shows an XPS spectrum of Nb3d. The spectrum for the semiconductor electrode of Inventive Example 1 is indicated by a solid line. For comparison, FIG. 6A also shows XPS spectra for laminate A of niobium oxynitride layer/substrate and laminate B of niobium oxide layer/substrate. The spectrum for laminate A is indicated by a broken line. The spectrum for laminate B is indicated by a line composed of x points. As a substrate in each of laminate A and laminate B for comparison, a c-sapphire substrate was used. The niobium oxynitride layer of laminate A was prepared by a method identical to that for the semiconductor layer of the semiconductor electrode of Inventive Example 1, and had a thickness of 80 nanometers. The niobium oxynitride layer of laminate B was prepared by the reactive sputtering method shown in Inventive Example 1, and had a thickness of 80 nanometers.

For the XPS spectrum of Nb3d, a shape and peak position of the spectrum for the semiconductor electrode of Inventive Example 1 are not coincident with a shape and peak position of the spectrum derived from niobium oxide of laminate B, and are roughly coincident with a shape and peak position of the spectrum derived from niobium oxynitride of laminate A. This result suggests that the protection layer (layer formed of aluminum oxynitride) of the semiconductor electrode of Inventive Example 1 is formed in a thickness of not more than 5 nanometers.

A chemical shift of a peak position observed in XPS will now be described. Chemical bonding occurs due to interaction of outermost shell electrons between elements, and core electrons are also influenced, thus causing a chemical shift. A magnitude of the chemical shift is considerably influenced by a difference in electronegativity (relative scale of strength with which atoms in a molecule attract electrons) between bonding elements, and a valence of an element. For example, a position of an XPS peak observed with a bond between elements having a large electronegativity difference is chemically shifted to a high energy side as compared to a position of an XPS peak observed with a bond between elements having a small electronegativity difference. It is known that the position of the XPS peak is chemically shifted to the high energy side as the valence of an element increases.

FIG. 6B shows an XPS spectrum of N1s. The spectrum for the semiconductor electrode of Inventive Example 1 is indicated by a solid line. For comparison, FIG. 6B also shows an XPS spectrum for laminate A. The spectrum for laminate A is indicated by a broken line. First, it is apparent that nitrogen is present on the surface of the protection layer of the semiconductor electrode of Inventive Example 1 because the XPS spectrum for the semiconductor electrode of Inventive Example 1 is observed. A peak position of a spectrum derived from niobium oxynitride in laminate A is shifted to a high energy side as compared to a peak position of a spectrum derived from aluminum oxynitride/niobium oxynitride in the semiconductor electrode of Inventive Example 1. This may be because as described above, niobium oxynitride in laminate A has a large electronegativity difference between elements, resulting in occurrence of the chemical shift to the high energy side. Thus, FIG. 6B shows that the XPS spectrum of N1s for the semiconductor electrode of Inventive Example 1 is an XPS spectrum of N1s derived from aluminum oxynitride/niobium oxynitride, and is different from the XPS spectrum of N1s derived from niobium oxynitride in laminate A.

FIG. 6C shows an XPS spectrum of Al2p. The spectrum for the semiconductor electrode of Inventive Example 1 is indicated by a solid line. For comparison, FIG. 6C also shows an XPS spectrum for laminate C of layer (thickness: 3 nanometers) formed of aluminum oxide/Si substrate. The spectrum for laminate C is indicated by a broken line. Laminate C for comparison was obtained by depositing aluminum oxide in a thickness of 3 nanometers on a Si substrate by an atomic layer deposition method. Specifically, TMA was used as a plasma ALD raw material gas, Ar was used as a purge gas, $O_2$ was used as a reactant gas, and a number of deposition cycles was 22. One cycle included supply of TMA as a raw material gas, purge of TMA, supply of $O_2$ and generation of plasma, and purge of $O_2$ in this order. In one cycle, a TMA supply time was 0.06 seconds, an $O_2$ supply time was 20 seconds, a plasma exposure time was 17 seconds, and each of a TMA exhaust time and an $O_2$ exhaust time was 5 seconds. A time of one cycle was about 30 seconds. By ellipsometry, the layer of laminate C, which was formed of aluminum oxide, was confirmed to have a thickness of 3 nanometers.

In an XPS spectrum, a peak intensity area is known to be proportional to an abundance of an element. According to the spectrum shown in FIG. 6C, it is suggested from comparison with laminate C that a range in which Al is present in the semiconductor electrode of Inventive Example 1 is within a range extending from a surface to a depth of not more than 3 nanometers. More specifically, a range in which Al is present in the semiconductor electrode of Inventive Example 1 extends to a depth equivalent to about ⅓ of a range in which Al is present in laminate C. That is, FIG. 6C suggests that the protection layer in the semiconductor electrode of Inventive Example 1 has a targeted thickness of about 1 nanometer.

It was confirmed from the above-described XPS results that in Inventive Example 1, aluminum oxynitride was hardly etched by an etching effect which was possibly produced by a self-bias voltage in plasma even after plasma treatment. That is, it was confirmed that in the semiconductor electrode of Inventive Example 1, aluminum oxynitride did not disappear, and was present as a 1 nanometer-thick extremely thin film on niobium oxynitride without problems.

Inventive Example 2

A semiconductor electrode of Inventive Example 2 was prepared by a method similar to that in Inventive Example 1 except that a time of plasma treatment for an oxide layer composed of aluminum oxide was 5 minutes.

Inventive Example 3

A semiconductor electrode of Inventive Example 3 was prepared by a method similar to that in Inventive Example 1 except that a thickness of an oxide layer composed of aluminum oxide was 3 nanometers. The 3 nanometer-thick oxide layer was obtained by depositing aluminum oxide in a thickness of 3 nanometers by an atomic layer deposition method. Specifically, TMA was used as a plasma ALD raw material gas, Ar was used as a purge gas, $O_2$ was used as a reactant gas, and a number of deposition cycles was 22. Details and a required time of one cycle were identical to those in preparation of the oxide layer by an atomic layer deposition method in Inventive Example 1.

Inventive Example 4

A semiconductor electrode of Inventive Example 4 was prepared by a method similar to that in Inventive Example 3 except that a time of plasma treatment for an oxide layer composed of aluminum oxide was 5 minutes.

Comparative Example 1

A semiconductor electrode of Comparative Example 1 was prepared by a method similar to that in Inventive Example 1 except that a protection layer was not provided. That is, the semiconductor electrode of Comparative Example 1 had a configuration in which a layer composed of niobium oxynitride was provided as a semiconductor layer on a conductive substrate.

Comparative Example 2

A semiconductor electrode of Comparative Example 2 was prepared by a method similar to that in Inventive Example 1 except that a 1 nanometer-thick layer formed of aluminum oxide was provided as a protection layer. That is, in Comparative Example 2, a semiconductor electrode was obtained by a method similar to that in Inventive Example 1 except that an oxide layer was not subjected to plasma treatment.

Comparative Example 3

A semiconductor electrode of Comparative Example 3 was prepared by a method similar to that in Inventive Example 3 except that a 3 nanometer-thick layer formed of aluminum oxide was provided as a protection layer. That is, in Comparative Example 3, a semiconductor electrode was obtained by a method similar to that in Inventive Example 3 except that an oxide layer was not subjected to plasma treatment.

(Measurement of Photocurrent)

For each of the semiconductor electrodes of Inventive Examples 1 to 4 and Comparative Examples 1 to 3, a photocurrent was measured. The measurement of the photocurrent was performed by a method as described below.

As a solution, one obtained by adding 0.1 mM $H_2O_2$ as a hole scavenger for measuring an amount of holes reaching a surface of an electrode to a phosphate buffer (pH=6.7). As a light source, a 250 W mercury lamp (wavelength $\lambda$=436 nanometers) was used. Measurement was performed in a three-pole mode by use of an electrochemical measurement system (manufactured by Solartron Analytical Company, Model: 1255 WB). During measurement, an applied voltage was 0.5 volts and an optical intensity was 37.2 mW/cm$^2$. Measurement results are shown in Table 1.

TABLE 1

| | Semiconductor electrode | | | | | |
|---|---|---|---|---|---|---|
| | Protection layer | | | Semiconductor layer | | |
| | Material of protection layer | Thickness of oxide layer before plasma treatment | Plasma treatment time | Material of semiconductor layer | Thickness | Photocurrent density ($\mu$A/cm$^2$) |
| Inventive Example 1 | Al oxynitride | 1 nm | 1 minute | Nb oxynitride | 80 nm | 97.8 |
| Inventive Example 2 | Al oxynitride | 1 nm | 5 minutes | Nb oxynitride | 80 nm | 51.7 |
| Inventive Example 3 | Al oxynitride | 3 nm | 1 minute | Nb oxynitride | 80 nm | 0.9 |
| Inventive Example 4 | Al oxynitride | 3 nm | 5 minutes | Nb oxynitride | 80 nm | 0.2 |
| Comparative Example 1 | — | — | — | Nb oxynitride | 80 nm | 86.0 |
| Comparative Example 2 | Al oxide | 1 nm | — | Nb oxynitride | 80 nm | 1.1 |
| Comparative Example 3 | Al oxide | 3 nm | — | Nb oxynitride | 80 nm | 0 |

First, Inventive Examples 1 and 2 and Comparative Example 2 in which the thickness of the protection layer was 1 nanometer, and Comparative Example 1 in which the protection layer was not provided are compared to one another. The semiconductor electrode of Comparative Example 1 in which the protection layer was not provided had a photocurrent density of 86.0 $\mu$A/cm$^2$. The semiconductor electrode of Comparative Example 2 in which a 1 nanometer-thick aluminum oxide layer was provided as the protection layer had a photocurrent density of 1.1 $\mu$A/cm$^2$. These results show that minor carriers cannot tunnel through a 1 nanometer-thick aluminum oxide layer. On the other hand, the semiconductor electrode of Inventive Example 1 in which aluminum oxide was deposited in a thickness of 1 nanometer, and the resulting oxide layer was then subjected to plasma treatment for 1 minute to form an aluminum oxynitride layer had a photocurrent density of 97.8 $\mu$A/cm$^2$. The semiconductor electrode of Inventive Example 2 in which aluminum oxide was deposited in a thickness of 1 nanometer, and the resulting oxide layer was then subjected to plasma treatment for 5 minutes to form an aluminum oxynitride layer had a photocurrent density of 51.7 $\mu$A/cm$^2$. Thus, the semiconductor electrode of each of Inventive Examples 1 and 2, which had a protection layer obtained by subjecting an oxide layer to plasma treatment, had a considerably improved photocurrent density as compared to the semiconductor electrode of Comparative Example 2. This result shows that in a semiconductor electrode in which by plasma treatment, nitrogen was introduced into composition of a protection layer to form an oxynitride rather than depositing aluminum oxide as a protection layer, a potential barrier of the protection layer was reduced to protect a surface of the semiconductor layer without impairing water splitting characteristics.

Next, Inventive Examples 3 and 4 and Comparative Example 3 in which the thickness of the protection layer was 3 nanometers, and Comparative Example 1 in which the protection layer was not provided are compared to one another. The semiconductor electrode of Comparative Example 1 in which the protection layer was not provided had a photocurrent density of 86.0 $\mu$A/cm$^2$ as described above. The semiconductor electrode of Comparative Example 3 in which a 3 nanometer-thick aluminum oxide layer was provided as the protection layer had a photocurrent density of 0 $\mu$A/cm$^2$. These results show that when niobium oxynitride is used as a semiconductor, minor carriers cannot tunnel through a 3 nanometer-thick aluminum oxide layer. On the other hand, the semiconductor electrode of Inventive Example 3 in which aluminum oxide was deposited in a thickness of 3 nanometers, and the resulting oxide layer was then subjected to plasma treatment for 1 minute to form an aluminum oxynitride layer had a photocurrent density of 0.9 $\mu$A/cm$^2$. The semiconductor electrode of Inventive Example 4 in which aluminum oxide was deposited in a thickness of 3 nanometers, and the resulting oxide layer was then subjected to plasma treatment for 5 minutes to form an aluminum oxynitride layer had a photocurrent density of 0.2 $\mu$A/cm$^2$. Thus, the semiconductor electrode of each of Inventive Examples 3 and 4, which had a protection layer obtained by subjecting an oxide layer to plasma treatment, had an improved photocurrent density as compared to the semiconductor electrode of Comparative Example 3. This result shows that in a semiconductor electrode in which by plasma treatment, nitrogen was introduced into composition of a protection layer to form an oxynitride rather than depositing aluminum oxide as a protection layer, a potential barrier of the protection layer was reduced to protect a surface of the semiconductor layer without impairing water splitting characteristics.

The semiconductor electrode according to the present disclosure is useful in, for example, photocatalyst related techniques such as devices for producing hydrogen from sunlight.

REFERENCIAL SIGNS LIST 100 semiconductor before plasma treatment
101 conductive substrate
102 semiconductor layer
103 protection layer
200 plasma apparatus
201 upper electrode
202 plasma
203 lower electrode (holding electrode)
204 heater
205 matching unit
206 high frequency power source
300 oxide layer
400 hydrogen production device
41 housing
41a light-transmissive surface
42 separator
43a first space
43b second space
45 counter electrode
46 electrolyte solution
47 electrical connector
48 hydrogen gas outlet
49 oxygen gas outlet

CONCLUSION

The invention derived from the above disclosure will be listed below.

A1. A semiconductor electrode, comprising:
 a conductive substrate;
 a semiconductor layer which is provided on the conductive substrate and is capable of absorbing visible light; and
 a protection layer with which the semiconductor layer is coated,
 wherein
 the protection layer is formed of an oxynitride;
 the visible light is capable of traveling through the protection layer; and
 the protection layer has a thinner thickness than the semiconductor layer.

A2. The semiconductor electrode according to Item A1, wherein
 the oxynitride forming the protection layer is an oxynitride of one selected from the group consisting of aluminum, silicon, and zirconium.

A3. The semiconductor electrode according to Item A2, wherein
 the oxynitride forming the protection layer is an aluminum oxynitride.

A4. The semiconductor electrode according to Item A1, wherein
 the semiconductor layer is formed of one selected from the group consisting of a nitride semiconductor and an oxynitride semiconductor.

A5. The semiconductor electrode according to Item A4, wherein
 the semiconductor layer is formed of a nitride semiconductor; and
 the nitride semiconductor is a nitride semiconductor of a transition metal selected from the group consisting of vanadium, niobium and tantalum.

A6. The semiconductor electrode according to Item A5, wherein
 the nitride semiconductor is a niobium nitride semiconductor.

A7. The semiconductor electrode according to Item A4, wherein
 the semiconductor layer is formed of an oxynitride semiconductor; and
 the oxynitride semiconductor is an oxynitride semiconductor of a transition metal selected from the group consisting of vanadium, niobium and tantalum.

A8. The semiconductor electrode according to Item A7, wherein
 the nitride semiconductor is a niobium oxynitride semiconductor.

B1. A gas generation device, comprising:
 a semiconductor electrode comprising:
  a conductive substrate;
  a semiconductor layer which is provided on the conductive substrate and is capable of absorbing visible light; and
  a protection layer with which the semiconductor layer is coated,
  wherein
  the protection layer is formed of an oxynitride;
  the visible light is capable of traveling through the protection layer; and
  the protection layer has a thinner thickness than the semiconductor layer;
 a counter electrode connected electrically with the conductive substrate;
 an electrolyte aqueous solution in contact with the semiconductor electrode and the counter electrode; and
 a container in which the semiconductor electrode, the counter electrode, and the electrolyte aqueous solution are contained.

C1. A fabrication method of a semiconductor electrode, the method comprising:
 (a) forming a semiconductor layer capable of absorbing visible light on a conductive substrate;
 (b) coating the semiconductor layer with an oxide layer; and
 (c) treating the oxide layer with plasma of a gas containing nitrogen to convert the oxide layer into an oxynitride layer which is formed of an oxynitride and through which the visible light is capable of travelling.

C2. The fabrication method of the semiconductor electrode according to Item C1, wherein
 the semiconductor layer is formed of one selected from the group consisting of a nitride semiconductor and an oxynitride semiconductor.

C3. The fabrication method of the semiconductor electrode according to Item C2, wherein
 the semiconductor layer is formed of a nitride semiconductor; and
 the nitride semiconductor is a nitride semiconductor of a transition metal selected from the group consisting of vanadium, niobium and tantalum.

C4. The fabrication method of the semiconductor electrode according to Item C3, wherein
 the nitride semiconductor is a niobium nitride semiconductor.

C5. The fabrication method of the semiconductor electrode according to Item C2, wherein the semiconductor layer is formed of an oxynitride semiconductor; and the oxynitride semiconductor is an oxynitride semiconductor of a transition metal selected from the group consisting of vanadium, niobium and tantalum.

C6. The fabrication method of the semiconductor electrode according to Item C5, wherein the nitride semiconductor is a niobium oxynitride semiconductor.

C7. The fabrication method of the semiconductor electrode according to Item C2, wherein in the step (c), the treatment increases a nitrogen concentration of a part of the semiconductor layer near the oxide layer.

C8. The fabrication method of the semiconductor electrode according to Item C1, wherein the plasma is generated by applying a high frequency voltage having a frequency band of not less than 30 MHz and not more than 300 MHz to the gas.

C9. The fabrication method according to Item C1, wherein the gas has an oxygen partial pressure of not more than 0.1%.

C10. The fabrication method according to Item C1, wherein the gas has a rotation temperature of not less than 480 Kelvin and not more than 1,100 Kelvin.

C11. The fabrication method according to Item C1, wherein in the step (c), the plasma is generated by applying a voltage between a pair of electrodes;

one electrode of the pair of the electrodes has a surface formed of stainless;

in the step (a), the conductive substrate is disposed on the surface of the one electrode of the pair of the electrodes; and the surface of the one electrode of the pair of the electrodes faces another electrode of the pair of the electrodes.

D1. A method for generating hydrogen, the method comprising:

(a) preparing a hydrogen generation device, comprising:

(i) a semiconductor electrode comprising:

a conductive substrate;

a semiconductor layer which is provided on the conductive substrate and is capable of absorbing visible light; and a protection layer with which the semiconductor layer is coated, wherein the protection layer is formed of an oxynitride;

the visible light is capable of traveling through the protection layer; and the protection layer has a thinner thickness than the semiconductor layer;

(ii) a counter electrode connected electrically with the conductive substrate;

(iii) an electrolyte aqueous solution in contact with the semiconductor electrode and the counter electrode; and (iv) a container in which the semiconductor electrode, the counter electrode, and the electrolyte aqueous solution are contained; and (b) irradiating the semiconductor electrode with light to generate hydrogen by splitting water molecules contained in the electrolyte aqueous solution on a surface of the counter electrode.

D2. The method according to Item D1, wherein the oxynitride forming the protection layer is an oxynitride of one selected from the group consisting of aluminum, silicon, and zirconium.

D3. The method according to Item D2, wherein the oxynitride forming the protection layer is an aluminum oxynitride.

D4. The method according to Item D1, wherein the semiconductor layer is formed of one selected from the group consisting of a nitride semiconductor and an oxynitride semiconductor.

D5. The method according to Item D4, wherein the semiconductor layer is formed of a nitride semiconductor; and the nitride semiconductor is a nitride semiconductor of a transition metal selected from the group consisting of vanadium, niobium and tantalum.

D6. The method according to Item D5, wherein the nitride semiconductor is a niobium nitride semiconductor.

D7. The method according to Item D4, wherein the semiconductor layer is formed of an oxynitride semiconductor; and the oxynitride semiconductor is an oxynitride semiconductor of a transition metal selected from the group consisting of vanadium, niobium and tantalum.

D8. The method according to Item D7, wherein the nitride semiconductor is a niobium oxynitride semiconductor.

The invention claimed is:

1. A semiconductor electrode, comprising:

a conductive substrate;

a semiconductor layer which is provided on the conductive substrate and is capable of absorbing visible light; and a protection layer with which the semiconductor layer is coated, wherein the protection layer is formed of an oxynitride;

the visible light is capable of traveling through the protection layer; and the protection layer has a thinner thickness than the semiconductor layer.

2. The semiconductor electrode according to claim 1, wherein the oxynitride forming the protection layer is an oxynitride of one selected from the group consisting of aluminum, silicon, and zirconium.

3. The semiconductor electrode according to claim 2, wherein the oxynitride forming the protection layer is an aluminum oxynitride.

4. The semiconductor electrode according to claim 1, wherein the semiconductor layer is formed of one selected from the group consisting of a nitride semiconductor and an oxynitride semiconductor.

5. The semiconductor electrode according to claim 4, wherein the semiconductor layer is formed of a nitride semiconductor; and the nitride semiconductor is a nitride semiconductor of a transition metal selected from the group consisting of vanadium, niobium and tantalum.

6. The semiconductor electrode according to claim 5, wherein the nitride semiconductor is a niobium nitride semiconductor.

7. The semiconductor electrode according to claim 4, wherein the semiconductor layer is formed of an oxynitride semiconductor; and the oxynitride semiconductor is an oxynitride semiconductor of a transition metal selected from the group consisting of vanadium, niobium and tantalum.

8. The semiconductor electrode according to claim 7, wherein
the nitride semiconductor is a niobium oxynitride semiconductor.

9. A gas generation device, comprising:
a semiconductor electrode comprising:
  a conductive substrate;
  a semiconductor layer which is provided on the conductive substrate and is capable of absorbing visible light; and
  a protection layer with which the semiconductor layer is coated, wherein
  the protection layer is formed of an oxynitride;
  the visible light is capable of traveling through the protection layer; and
  the protection layer has a thinner thickness than the semiconductor layer;
a counter electrode connected electrically with the conductive substrate;
an electrolyte aqueous solution in contact with the semiconductor electrode and the counter electrode; and
a container in which the semiconductor electrode, the counter electrode, and the electrolyte aqueous solution are contained.

* * * * *